US012183786B2

(12) United States Patent
Hong et al.

(10) Patent No.: US 12,183,786 B2
(45) Date of Patent: Dec. 31, 2024

(54) MULTI-STACK SEMICONDUCTOR DEVICE WITH ZEBRA NANOSHEET STRUCTURE

(71) Applicant: SAMSUNG ELECTRONICS CO., LTD., Suwon-si (KR)

(72) Inventors: Byounghak Hong, Albany, NY (US); Seungchan Yun, Waterford, NY (US); Kang-ill Seo, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 463 days.

(21) Appl. No.: 17/536,939

(22) Filed: Nov. 29, 2021

(65) Prior Publication Data
US 2023/0101171 A1    Mar. 30, 2023

Related U.S. Application Data

(60) Provisional application No. 63/248,836, filed on Sep. 27, 2021.

(51) Int. Cl.
| H01L 29/06 | (2006.01) |
| H01L 29/423 | (2006.01) |
| H01L 29/66 | (2006.01) |
| H01L 29/786 | (2006.01) |

(52) U.S. Cl.
CPC .... *H01L 29/0665* (2013.01); *H01L 29/42392* (2013.01); *H01L 29/66742* (2013.01); *H01L 29/78618* (2013.01); *H01L 29/7869* (2013.01); *H01L 29/78696* (2013.01)

(58) Field of Classification Search
CPC ............ H01L 21/022; H01L 21/02304; H01L 21/02362; H01L 29/511–513; H01L 21/3143–3145; H01L 21/3142
See application file for complete search history.

(56) References Cited

U.S. PATENT DOCUMENTS

| 10,490,559 | B1 * | 11/2019 | Ando | .................. H01L 21/0262 |
| 10,658,462 | B2 | 5/2020 | Lee et al. | |
| 10,685,887 | B2 | 6/2020 | Smith et al. | |
| 10,748,994 | B2 | 8/2020 | Reznicek et al. | |

(Continued)

FOREIGN PATENT DOCUMENTS

CN          113206090 A          8/2021

*Primary Examiner* — Evren Seven
*Assistant Examiner* — Sarah L Ell
(74) *Attorney, Agent, or Firm* — Sughrue Mion, PLLC

(57) ABSTRACT

A multi-stack semiconductor device includes: a substrate; a multi-stack transistor formed on the substrate and including a nanosheet transistor and a fin field-effect transistor (FinFET) above the nanosheet transistor, wherein the nanosheet transistor includes a plurality nanosheet layers surrounded by a lower gate structure except between the nanosheet layers, the FinFET includes at least one fin structure, of which at least top and side surfaces are surrounded by an upper gate structure, and each of the lower and upper gate structures includes: a gate oxide layer formed on the nanosheet layers and the at least one fin structure; and a gate metal pattern formed on the gate oxide layer. At least one of the lower and upper gate structures includes an extra gate (EG) oxide layer formed between the gate oxide layer and the nanosheet layers and/or between the gate oxide layer and the at least one fin structure.

6 Claims, 19 Drawing Sheets

(56) References Cited

U.S. PATENT DOCUMENTS

| | | | |
|---|---|---|---|
| 10,833,078 B2 | 11/2020 | Smith et al. | |
| 10,879,352 B2 | 12/2020 | Zhang et al. | |
| 2019/0287864 A1* | 9/2019 | Cheng | H01L 21/823468 |
| 2019/0326286 A1 | 10/2019 | Xie et al. | |
| 2020/0006331 A1* | 1/2020 | Lilak | H01L 29/66545 |
| 2020/0235092 A1* | 7/2020 | Lilak | H01L 21/8221 |
| 2021/0210349 A1 | 7/2021 | Xie et al. | |
| 2021/0265345 A1 | 8/2021 | Xie et al. | |
| 2021/0375685 A1* | 12/2021 | Xie | H01L 21/823468 |
| 2022/0216327 A1* | 7/2022 | More | H01L 29/66795 |
| 2022/0399450 A1* | 12/2022 | Xie | H01L 29/775 |
| 2023/0090092 A1* | 3/2023 | Lilak | H01L 21/823842 |
| | | | 257/369 |

* cited by examiner

FIG. 1G
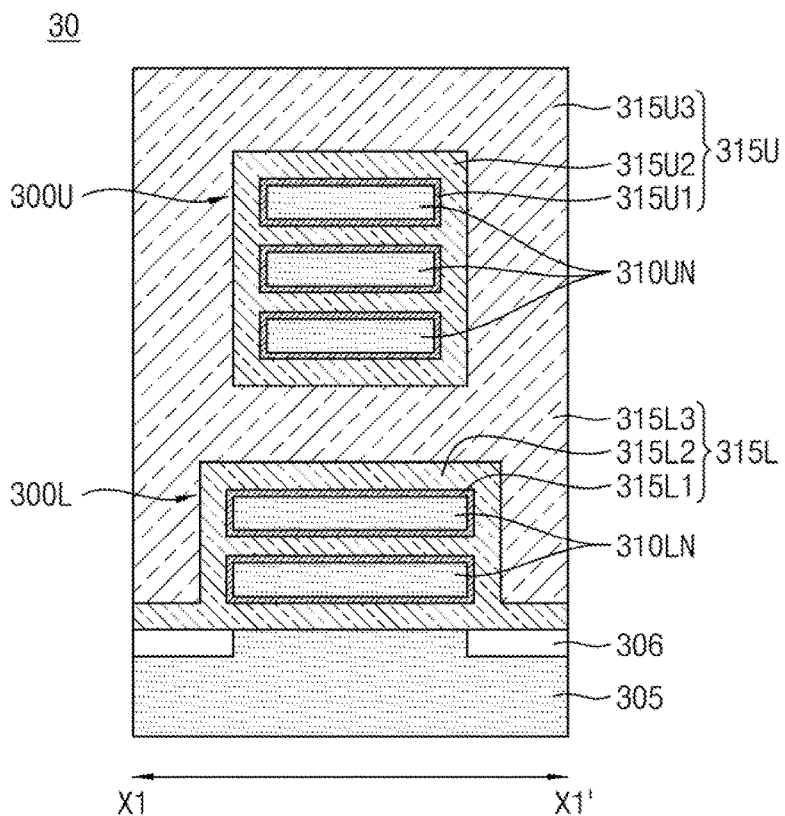
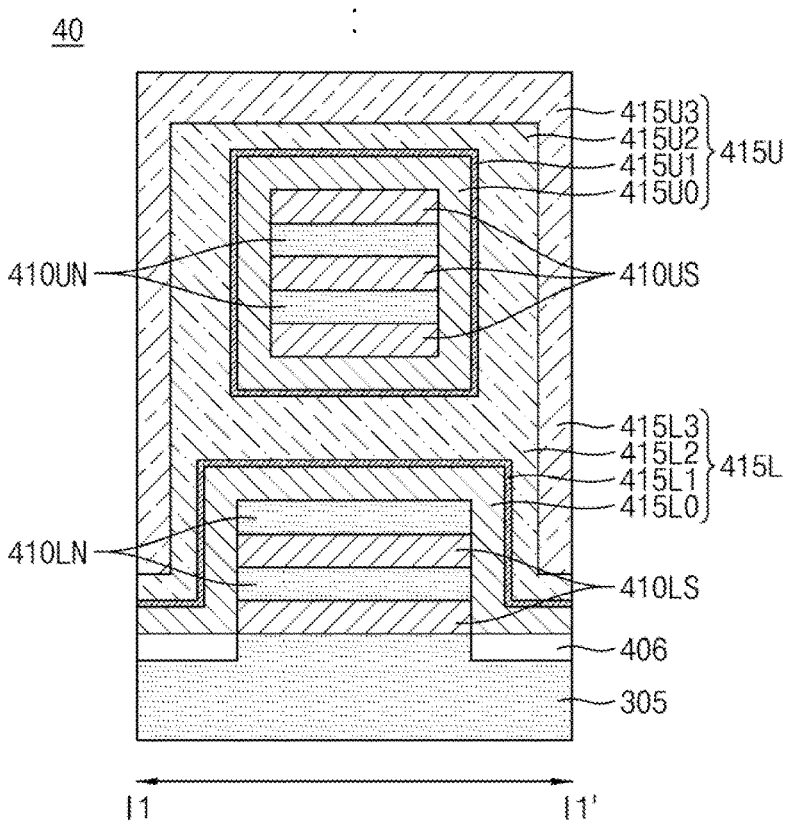

FIG. 2B
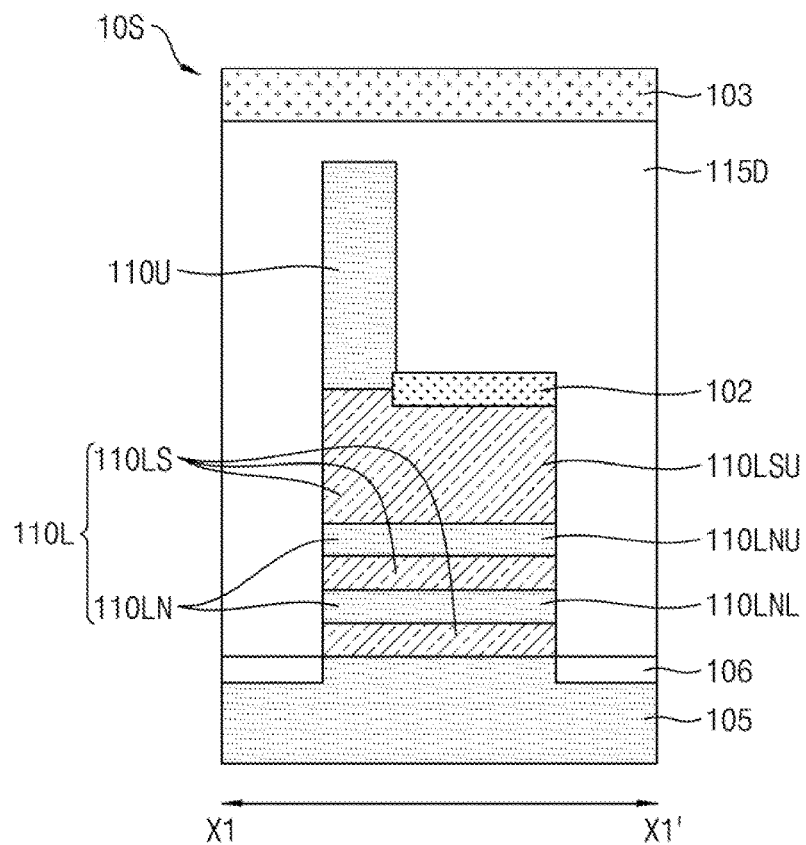
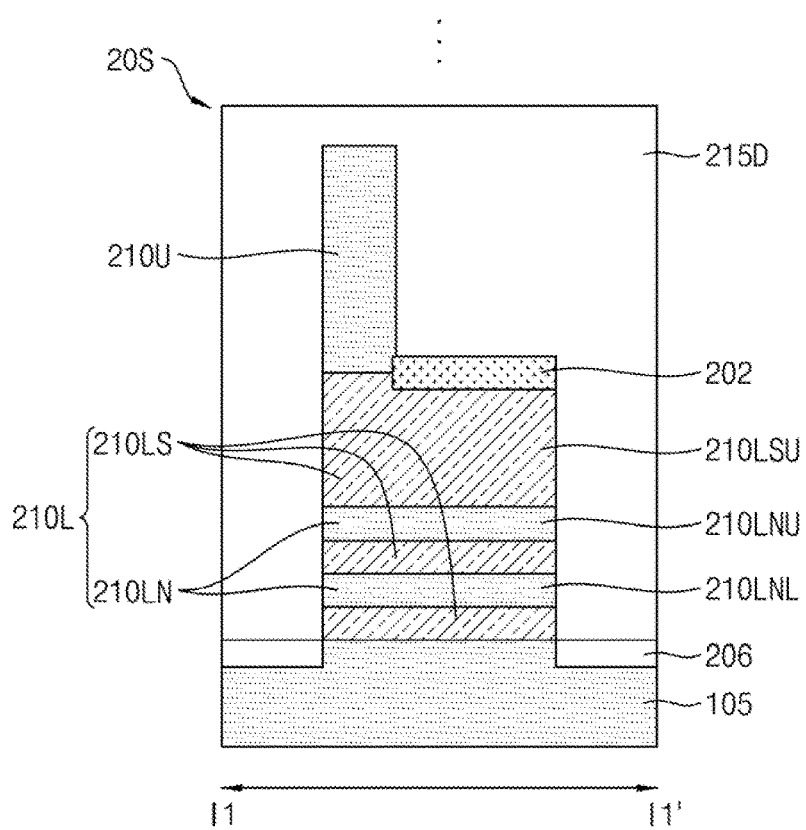

FIG. 2F
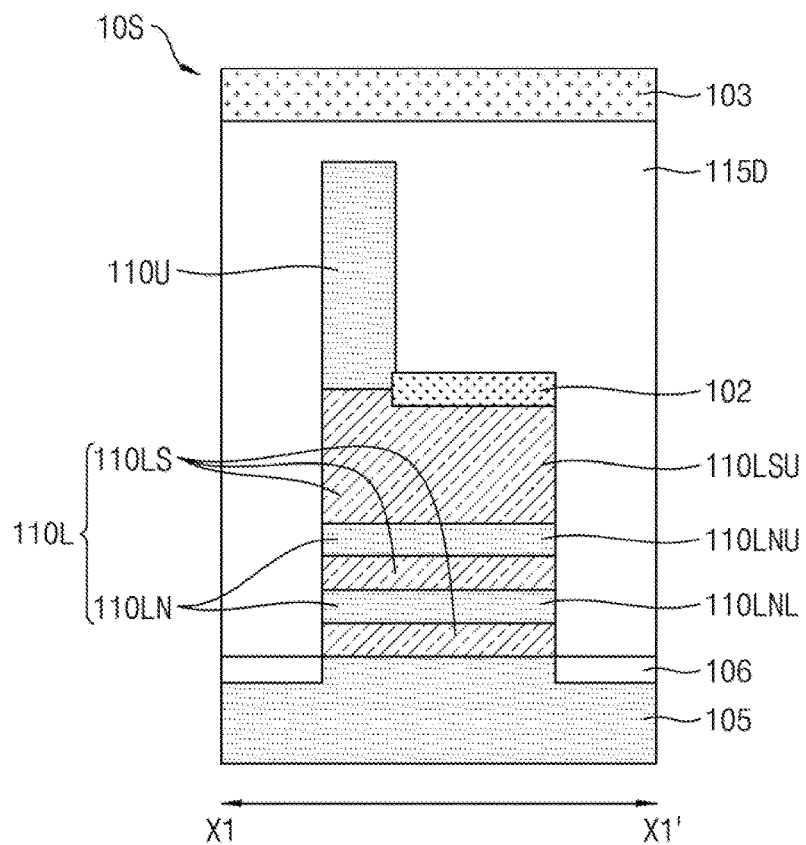
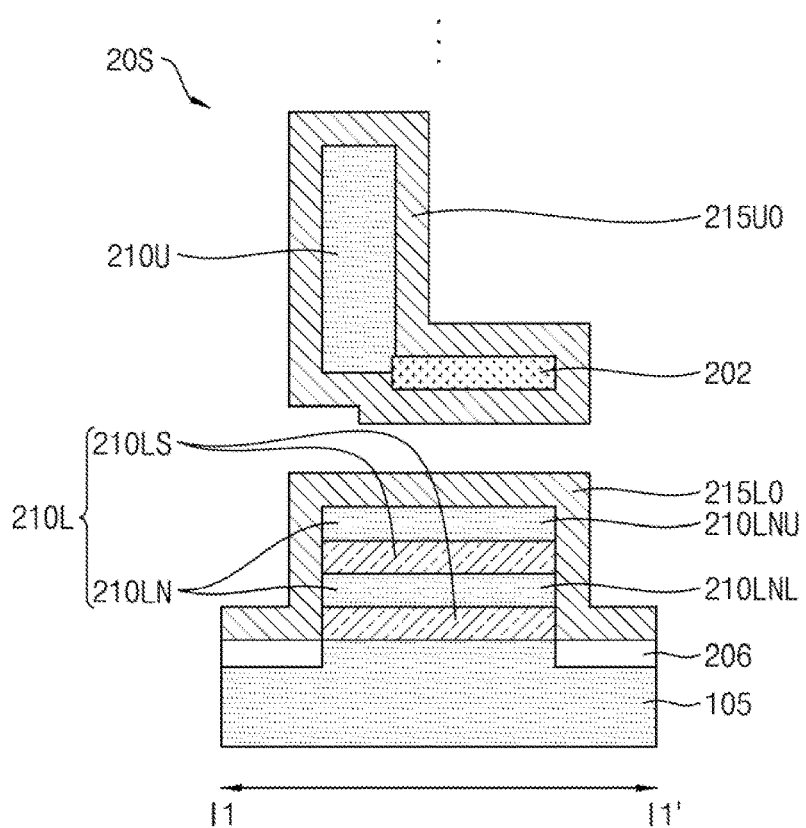

FIG. 2K
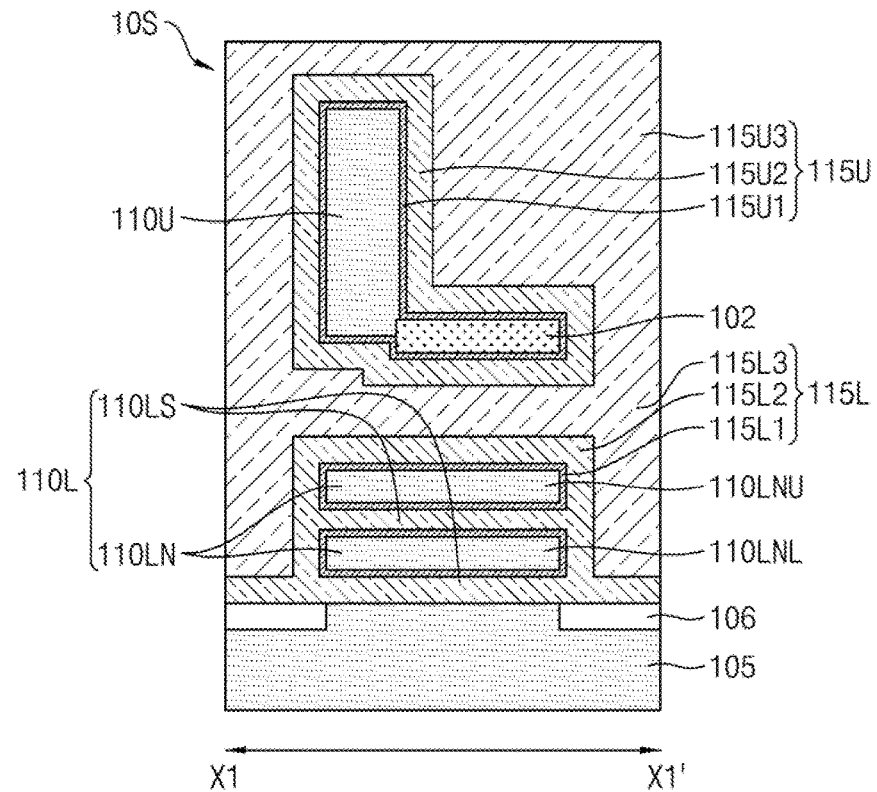
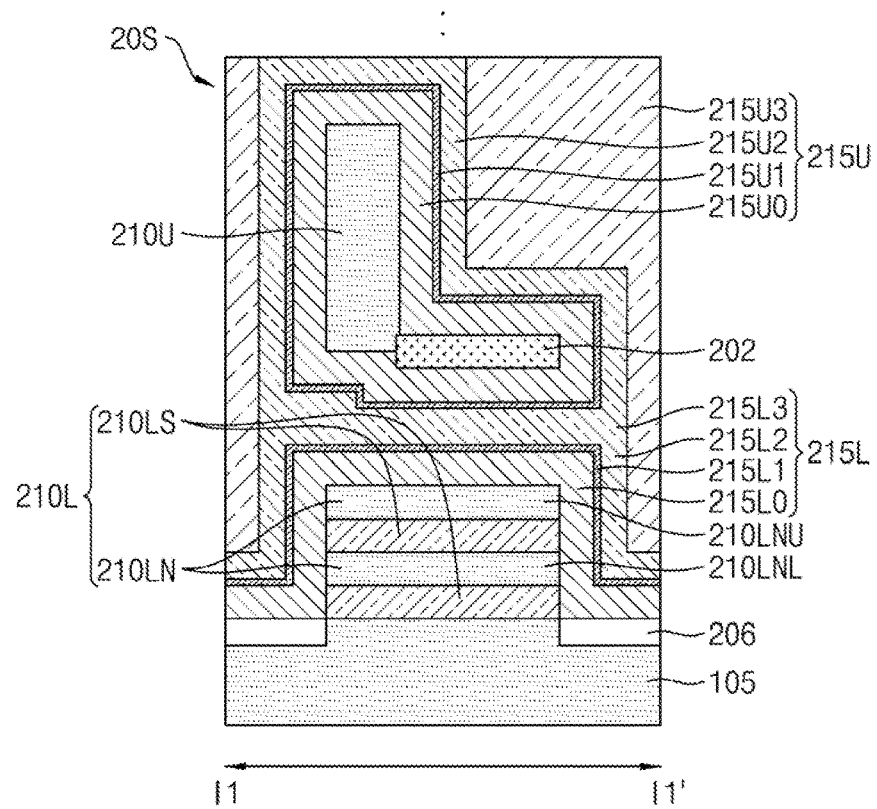

MULTI-STACK SEMICONDUCTOR DEVICE WITH ZEBRA NANOSHEET STRUCTURE

CROSS-REFERENCE TO THE RELATED APPLICATION

This application is based on and claims priority from U.S. Provisional Application No. 63/248,836 filed on Sep. 27, 2021 in the U.S. Patent and Trademark Office, the disclosure of which is incorporated herein in its entirety by reference.

BACKGROUND

1. Field

Apparatuses and methods related to example embodiments of the inventive concept relate to a multi-stack semiconductor device including a zebra nanosheet structure at a lower stack, and more particularly to, a multi-stack semiconductor device including a zebra nanosheet structure with an extra gate (EG) oxide layer, and a method of manufacturing the same.

2. Description of the Related Art

Growing demand for miniaturization and improved performance of a semiconductor device has introduced a nanosheet transistor. The nanosheet transistor is characterized by multiple nanosheet layers bridging source/drain electrodes formed at both ends thereof and a gate structure that wraps around all or many of the sides of the nanosheet layers. These nanosheet layers function as a channel structure for current flow between the source/drain electrodes of the nanosheet transistor. Due to this structure, improved control of current flow through the multiple nanosheet layers is enabled in addition to higher device density in a semiconductor device including the nanosheet transistor. The nanosheet transistor is also referred to with various different names such as multi-bridge channel FET (MBCFET), nanobeam, nanoribbon, superimposed channel device, etc.

In addition, as a multi-stack semiconductor device begins to attract an industry attention to achieve device density, a multi-stack nanosheet transistor structure including nanosheet transistors formed on lower and upper stacks has been developed. However, the nanosheet transistor requires a more complicated, costly manufacturing process compared to the FinFET, which can be manufactured through a more mature process and is still a very viable option due to its characteristics including improved current control performance and less current leakage. Thus, the inventors of the present application have conducted research into a multi-stack semiconductor device including a nanosheet transistor and a FinFET respectively formed in lower and upper stacks.

However, the inventors noted that when a transistor is designed to more reliably receive an input voltage, e.g., 1.5 v, at its gate structure or when the transistor is used for an analog circuit, a thick oxide layer is required to be included in the gate structure to prevent hard oxide breakdown of the gate structure. The inventors further noted that it is very difficult to form a gate structure having a thick oxide layer, which is referred to as "extra gate (EG) oxide layer", surrounding nanosheet layers due to the very limited dimensions between the nanosheet layers. In other words, an EG oxide structure is very difficult to be formed in the nanosheet transistor, and far more difficult in a nanosheet transistor located on a lower stack of a multi-stack transistor structure.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

The disclosure provides a multi-stack semiconductor device having a zebra nanosheet transistor and a FinFET on lower and upper stacks, and methods of manufacturing the same.

According to an embodiment, there is provided a multi-stack semiconductor device which may include a substrate; a multi-stack transistor formed on the substrate and including a nanosheet transistor and a fin field-effect transistor (FinFET) above the nanosheet transistor, wherein the nanosheet transistor includes a plurality nanosheet layers surrounded by a lower gate structure except between the nanosheet layers, the FinFET includes at least one fin structure, of which at least top and side surfaces are surrounded by an upper gate structure, and each of the lower and upper gate structures includes: a gate oxide layer formed on the nanosheet layers and the at least one fin structure; and a gate metal pattern formed on the gate oxide layer.

According to an embodiment, at least one of the lower and upper gate structures may include an extra gate (EG) oxide layer formed between the gate oxide layer and the nanosheet layers and/or between the gate oxide layer and the at least one fin structure.

According to an embodiment, there is provided an multi-stack semiconductor device which may include: a substrate; a multi-stack transistor formed on the substrate and including a lower nanosheet transistor and an upper nanosheet transistor above the lower nanosheet transistor, wherein each of the lower and upper nanosheet transistors includes a plurality nanosheet layers surrounded by a gate structure except between the nanosheet layers, and the gate structure comprises a gate oxide layer formed on the nanosheet layers, and a gate metal pattern formed on the gate oxide layer.

According to an embodiment, at least one of the gate structures may include an extra gate (EG) oxide layer formed between the gate oxide layer and the nanosheet layers.

According to embodiments, there is provided a method of manufacturing a multi-stack semiconductor device. The method may include: providing, on a substrate, a $1^{st}$ multi-stack semiconductor structure including a lower nanosheet stack and at least one fin structure above the nanosheet stack, wherein the nanosheet stack includes at least two nanosheet layers, at least one intervening layer interposed therebetween, respectively, and an upper intervening layer on the at least two nanosheet layers and below the at least one fin structure; depositing a dummy gate structure to enclose the $1^{st}$ multi-stack semiconductor structure, and forming source/drain regions and/or a gate spacer for at least one of the lower nanosheet stack and the at least one fin structure based on the dummy gate structure; removing the dummy gate structure and the upper intervening layer from the $1^{st}$ multi-stack semiconductor structure; depositing a lower gate oxide layer to surround the nanosheet stack, in which the at last one intervening layer is interposed between the at last two nanosheet layers, and depositing an upper gate oxide layer to surround the at least one fin structure; and depositing a lower gate metal pattern and an upper gate metal pattern to surround the lower gate oxide layer and the upper gate oxide layer, respectively.

According to the disclosed method of manufacturing an multi-stack semiconductor device, an EG oxide multi-stack transistor may be formed to use intervening layers as well as nanosheet layers interposed between the intervening layers as a channel structure of the multi-stack transistor. Further, the disclosed method of manufacturing an multi-stack semiconductor device may enable easy formation of an EG oxide layer on channel structures of the multi-stack transistor in the multi-stack semiconductor device. In addition, the disclosed method of manufacturing an multi-stack semiconductor device may enable to form both a multi-stack transistor including gate structures with a standard gate (SG) oxide layer and a multi-stack transistor including gate structures with an EG oxide layer on a same substrate.

BRIEF DESCRIPTION OF THE DRAWINGS

Example embodiments of the inventive concept will be more clearly understood from the following detailed description taken in conjunction with the accompanying drawings in which:

FIG. 1G illustrates an SG oxide multi-stack nanosheet transistor and an EG oxide multi-stack nanosheet transistor of a multi-stack semiconductor device, respectively, formed on a substrate, according to an embodiment;

FIGS. 2A to 2K illustrate a method of manufacturing the multi-stack semiconductor device of FIGS. 1A and 1E, according to an embodiment;

DETAILED DESCRIPTION OF THE EMBODIMENTS

Figure 1A:
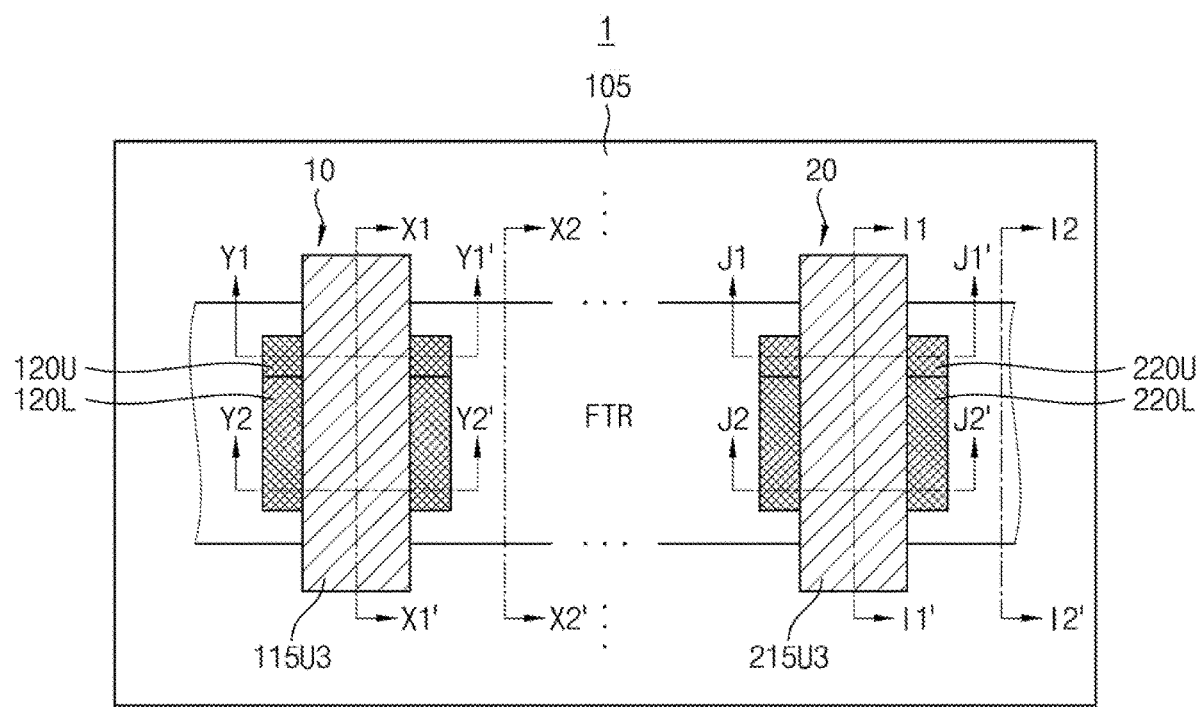
FIG. 1A illustrates a plan view of a multi-stack semiconductor device including a standard gate (SG) oxide multi-stack transistor and an extra gate (EG) oxide multi-stack transistor, according to an embodiment.

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a finFET and a nanosheet transistor described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

Many embodiments are described herein with reference to cross-sectional views that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to semiconductor devices including a nanosheet transistor and a finFET may or may not be described in detail herein.

Herebelow, it is understood that the term "transistor" may refer to a semiconductor device including a gate structure and source/drain electrodes on a substrate, and the term "transistor structure" may refer to an intermediate semiconductor device structure before at least one of the gate structure and the source/drain electrodes is formed to complete the semiconductor device structure as a transistor.

Figure 1B:
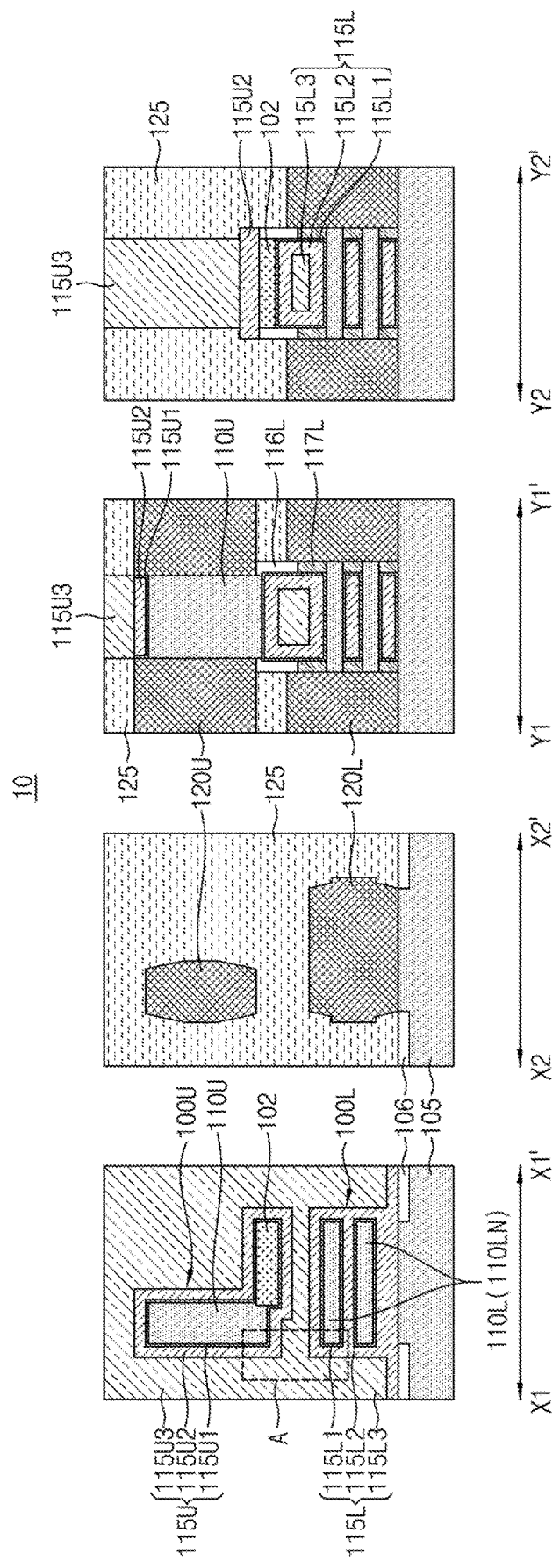
FIG. 1B illustrates cross-sectional views of the SG oxide multi-stack transistor taken along lines X1-X1', X2-X2', Y1-Y1' and Y2-Y2' shown in FIG. 1A.
Figure 1C:
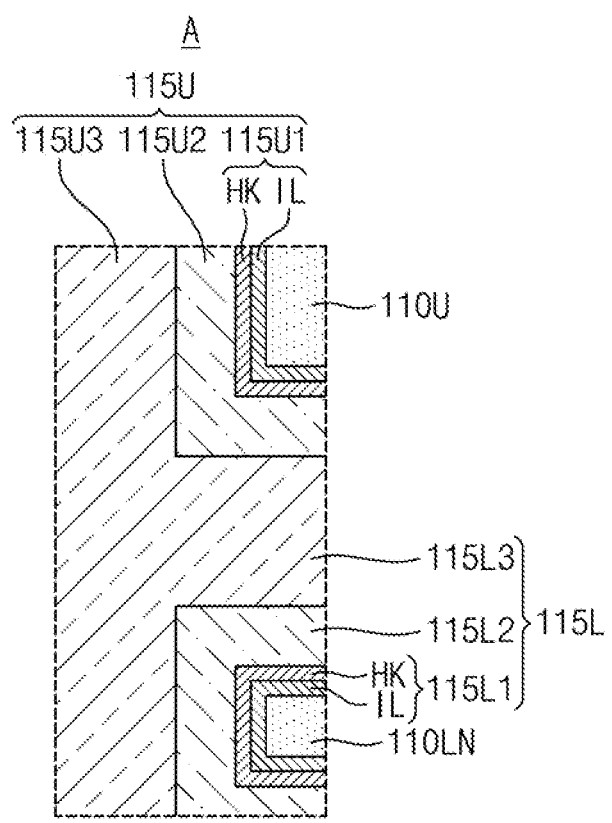
FIG. 1C illustrates an enlarged view of a portion A shown in FIG. 1B, according to an embodiment.
Figure 1D:
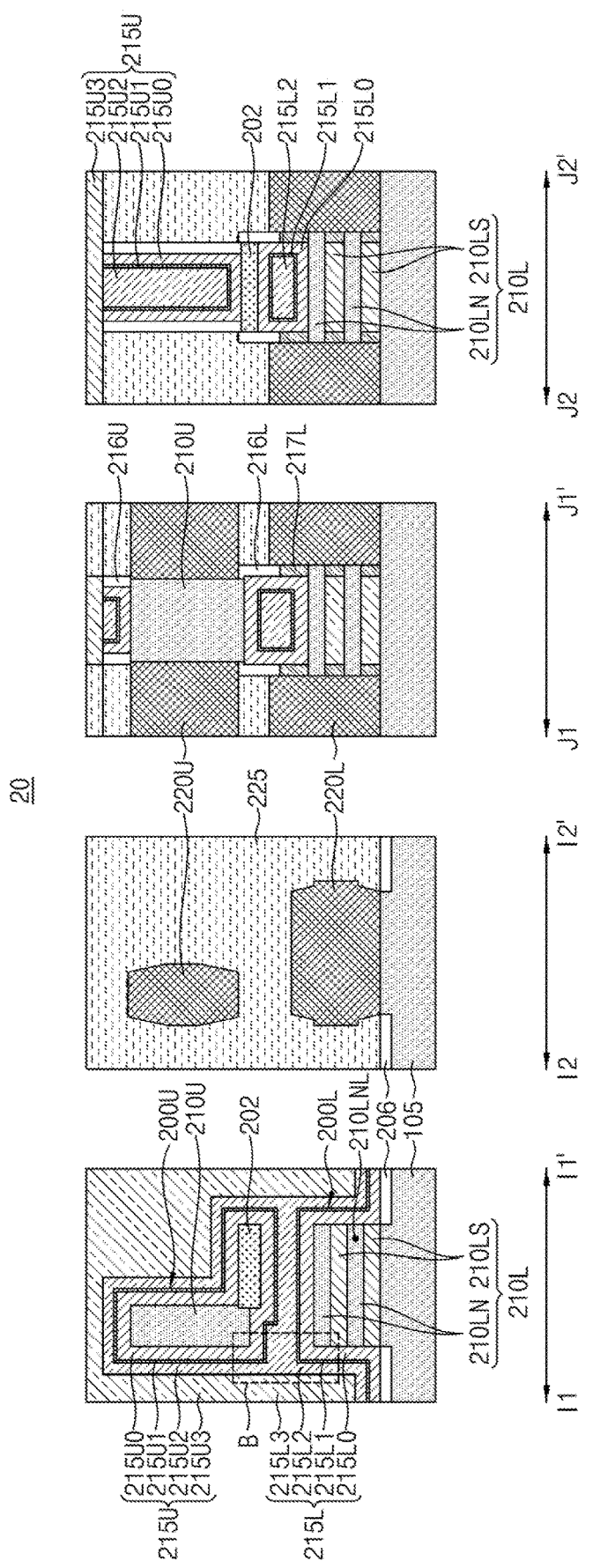
FIG. 1D illustrates cross-sectional views of the EG oxide multi-stack transistor taken along lines I1-I1', I2-I2', J1-J1' and J2-J2' shown in FIG. 1A.
Figure 1E:
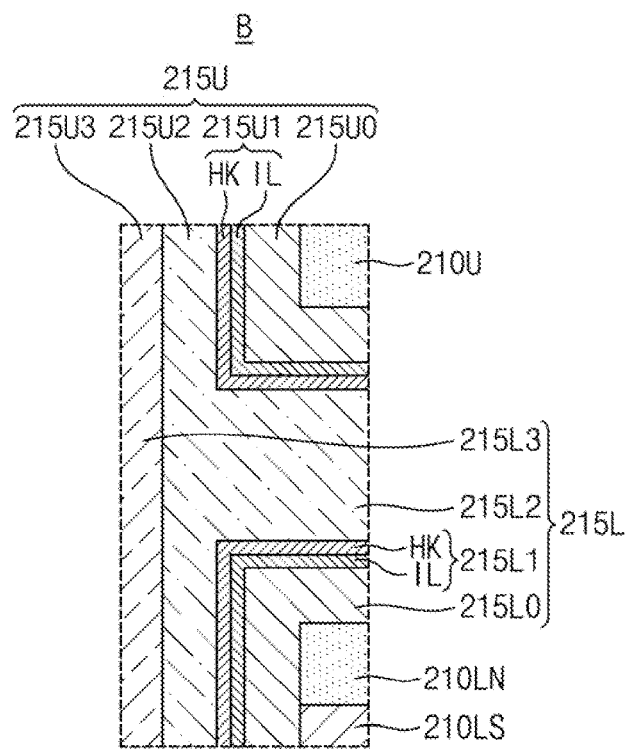
FIGS. 1E and 1F illustrate an enlarged view of a portion B shown in FIG. 1C, according to embodiments.
Figure 1F:
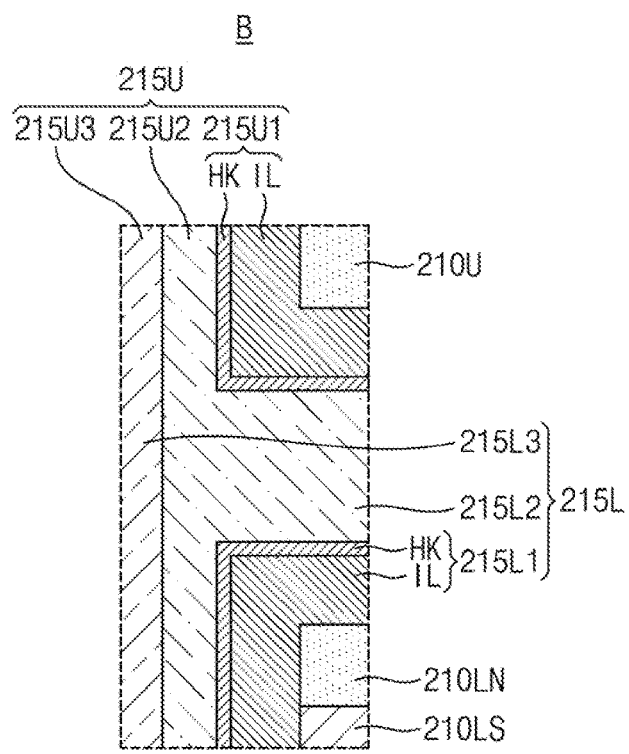

FIG. 1A illustrates a plan view of a multi-stack semiconductor device including a standard gate (SG) oxide multi-stack transistor and an extra gate (EG) oxide multi-stack transistor, according to an embodiment. FIG. 1B illustrates cross-sectional views of the SG oxide multi-stack transistor taken along lines X1-X1', X2-X2', Y1-Y1' and Y2-Y2' shown in FIG. 1A, and FIG. 1C illustrates an enlarged view of a portion A shown in FIG. 1B, according to an embodiment. FIG. 1D illustrates cross-sectional views of the EG oxide multi-stack transistor taken along lines I1-I1', I2-I2', J1-J1' and J2-J2' shown in FIG. 1A, and FIGS. 1E and 1F illustrate an enlarged view of a portion B shown in FIG. 1C, according to embodiments.

It is understood herein that the lines X1-X1', X2-X2', I1-I1' and I2-I2' are taken in a channel width direction, and the lines Y1-Y1', Y2-Y2', J1-J1' and J2-J2' are taken in a channel length direction in the multi-stack semiconductor device of the present embodiment. It is also understood that the SG oxide multi-stack transistor represents a multi-stack transistor having a standard or regular gate oxide layer in gate structures of the multi-stack transistor, and the EG oxide multi-stack transistor represents a multi-stack transistor having an extra gate oxide layer or a thick gate oxide layer in gate structures of the multi-stack transistor. Further, in showing a plan view of the multi-stack semiconductor device of the present embodiments, FIG. 1A does not show all elements of the SG oxide multi-stack transistor 10 and the EG oxide multi-stack transistor 20 formed on the substrate 105, for brevity purposes. For example, an interlayer dielectric structure isolating adjacent transistor structures, and various spacer layers that may be attached to gate structures to be described later are not shown in FIG. 1A.

Referring to FIGS. 1A to 1E, a multi-stack semiconductor device 1 may include an SG oxide multi-stack transistor 10 and an EG oxide multi-stack transistor 20 formed along a fin structure track FTR extended in the channel length direction on a substrate 105. FIG. 1A shows that only one SG oxide multi-stack transistor and only one EG oxide multi-stack transistor are formed along only one fin structure track on a substrate 105 to form the multi-stack semiconductor device of the present embodiments. However, this is only for convenient description purposes. According to an embodiment, the multi-stack semiconductor device 1 may include a plurality SG oxide multi-stack transistors having the same or similar structure and a plurality EG oxide multi-stack transistors having the same or similar structure on two or more fin structure tracks arranged in the channel width direction, according to embodiments.

As shown in FIGS. 1A and 1B, the SG oxide multi-stack transistor 10 may include a nanosheet transistor 100L and a FinFET 100U formed on a lower stack and an upper stack of the SG oxide multi-stack transistor 10, respectively, according to an embodiment. The SG oxide multi-stack transistor 10 may also include a shallow trench isolation (STI) structure 106 on the substrate 105 to isolate the SG oxide multi-stack transistor 10 from adjacent SG oxide multi-stack transistors or adjacent EG oxide multi-stack transistors formed on one or more fin structure tracks on the same substrate 105.

The substrate 105 may be a semiconductor substrate formed of silicon (Si) and/or germanium (Ge), or may be a silicon-on-insulator (SOI) substrate, and the STI structure may be formed of silicon dioxide ($SiO_2$), not being limited thereto, according to an embodiment.

In the SG oxide multi-stack transistor 10, the nanosheet transistor 100L may include a nanosheet stack 110L of a plurality nanosheet layers 110LN as a lower channel structure of the SG oxide multi-stack transistor, a lower gate structure 115L surrounding top, bottom and side surfaces of the nanosheet layers 110LN, and lower source/drain electrodes 120L for the SG oxide multi-stack transistor 10, as shown in FIG. 1B. The lower source/drain electrodes 120L may be epitaxially grown from the substrate 105 and the nanosheet layers 110LN.

The nanosheet layers 110LN may be formed of silicon (Si) which is doped by adding p-type dopants (e.g., boron or gallium) or n-type dopants (e.g., phosphorus or arsenic) depending on a type of nanosheet transistor to be formed based on the nanosheet layers 110LN. Although FIG. 1B shows that the nanosheet stack 110L includes only two nanosheet layers to form the nanosheet transistor 100L of the SG oxide multi-stack transistor 10, the number of nanosheet layers of the nanosheet transistor 100L may not be limited to two. More or less than two nanosheet layers may be formed to complete the nanosheet transistor 100L of the SG oxide multi-stack transistor 10, according to an embodiment.

Referring to FIGS. 1B and 1C, the lower gate structure 115L may include a lower gate oxide layer 115L1 layered on the nanosheet layers 110LN, a lower work-function metal layer 115L2 formed on the lower gate oxide layer 115L1, and a lower conductor plug 115L3 formed on the lower work-function metal layer 115L2. The lower gate oxide layer 115L1 may include an interfacial layer IL formed on the nanosheet layers 110LN, and a high-κ dielectric layer HK formed on the interfacial layer IL. The interfacial layer IL may be formed of silicon oxide (SiO), silicon dioxide ($SiO_2$), and/or silicon oxynitride (SiON), not being limited thereto, and the high-κ dielectric layer HK may be formed of a metal oxide material and/or one or more of high-κ materials such as hafnium (Hf), aluminum (Al), zirconium (Zr), lanthanum (La), magnesium (Mg), barium (Ba), titanium (Ti), and lead (Pb), not being limited thereto, having a dielectric constant value greater than 7, according to an embodiment. According to an embodiment, the dielectric constant of the high-κ dielectric layer HK may be greater than the oxide material of the interfacial layer IL. The interfacial layer IL may be provided for protecting the nanosheet layers 110LN, facilitating growth of the high-κ dielectric layer HK thereon, and providing a necessary characteristic interface with the nanosheet layers 110LN as the channel structure of the nanosheet transistor 100L. The high-κ dielectric layer HK may be provided to allow an increased gate capacitance without associated current leakage at the nanosheet layers 110LN. The lower gate oxide layer 115L1 including the interfacial layer IL and the high-κ dielectric layer HK may range 2 nm to 3 nm, according to an embodiment.

In the present embodiment, as the lower gate structure 115L surrounds the nanosheet layers 110LN at their top, bottom and side surfaces, the lower gate oxide layer 115L1 and the lower work-function metal layer 115L2 may be formed between the nanosheet layers 110LN and between the lowermost nanosheet layer 110LNL among the nanosheet layers 110LN and the substrate 105, as shown in FIG. 1B. However, the lower conductor plug 115L3 may not be formed between the nanosheet layers 110LN and between the lowermost nanosheet layer 110LNL among the nanosheet layers 110LN and the substrate 105 at least because of the nanoscale dimension of the nanosheet transistor 100L. The lower conductor plug 115L3 may be formed only on top and side surfaces of the nanosheet stack 110L in the present embodiment. However, according to an embodiment, the lower conductor plug 115L3 may also be formed between the nanosheet layers 110LN and between the lowermost nanosheet layer 110LNL at least subject to design needs.

The lower work-function metal layer 115L2 and the lower conductor plug 115L3 may be collectively referred to as a lower gate metal pattern. The lower work-function metal layer 115L2 may be formed of titanium (Ti), tantalum (Ta) or their compound such as TiN, TiAl, TiAlN, TaN, TiC, TaC, TiAlC, TaCN, TaSiN, and/or a combination thereof, not being limited thereto, according to an embodiment. The lower work-function metal layer 115L2 may be provided to modulate a desired threshold voltage Vt for the lower gate structure 115L of the nanosheet transistor 100L. The lower conductor plug 115L3 may be formed of copper (Cu), Al, tungsten (W), molybdenum (Mo), ruthenium (Ru) or their compound, not being limited thereto, according to an embodiment, to receive an input voltage of the nanosheet transistor 100L or for an internal routing of the nanosheet transistor 100L to an adjacent circuit in the multi-stack semiconductor device of the present embodiment.

Referring back to FIGS. 1A and 1B, the SG oxide multi-stack transistor 10 may also include the FinFET 100U formed above the nanosheet transistor 100L. The FinFET 100U may include a fin structure 110U as an upper channel structure of the SG oxide multi-stack transistor 10, an upper gate structure 115U surrounding the fin structure 110U, and upper source/drain electrodes 120U for the SG oxide multi-stack transistor 10. The upper source/drain electrodes 120U may be epitaxially grown from the fin structure 110U.

In the present embodiment as shown in FIG. 1B, the upper gate structure 115U may surround top, bottom and side surfaces of the fin structure 110U to form the FinFET 100U of the SG oxide multi-stack transistor 10, unlike a conventional FinFET of which only top and side surfaces are surrounded by a gate structure. With the upper gate structure 115U surrounding all surfaces of the fin structure 110U, the FinFET 100U may avoid current leakage through a bottom surface of the fin structure 110U, which is a problem of convention FinFETs. However, according to an embodiment, the FinFET 100U may be formed such that only the top and side surfaces are surrounded by the upper gate structure 115U, and the bottom surface contacts another substrate or an isolation structure separating the FinFET 100U from the nanosheet transistor 100L in the SG oxide multi-stack transistor 10, considering trade-offs between operation speed, power consumption, manufacturing complexity and costs of the FinFET 100U.

The fin structure 110U may be formed of silicon (Si), germanium (Ge), silicon germanium (SiGe), gallium arsenide (GaAs), gallium arsenide phosphide (GaAsP), or other suitable materials, not being limited thereto, according to an embodiment. The material(s) forming the fin structure 110U may also be doped by adding p-type dopants or n-type dopants depending on a type of FinFET to be formed based on the fin structure 110U. Although the FinFET 100U includes only one fin structure in the SG oxide multi-stack transistor 10 shown in FIG. 1B, two or more fin structures may be formed above the nanosheet transistor 10L to form the FinFET 100U of the SG oxide multi-stack transistor 10, according to an embodiment.

FIGS. 1B and 1C further shows that the upper gate structure 115U may include an upper gate oxide layer 115U1 layered on the fin structure 110U, an upper work-function metal layer 115U2 formed on the upper gate oxide layer 115U1, and an upper conductor plug 115U3 formed on the upper work-function metal layer 115U2. The upper gate oxide layer 115U1 may include an interfacial layer IL formed on the fin structure 110U and a high-κ layer HK formed on the interfacial layer IL as the lower gate oxide layer 115L1 of the nanosheet transistor 100L does. These interfacial layer IL and the high-κ dielectric layer of the upper gate oxide layer 115U1 may be formed of the same materials as those of the lower gate oxide layer 115L1 for the same purposes with respect to the FinFET 100U. Thus, duplicate descriptions are omitted herein.

The upper work-function metal layer 115U2 and the upper conductor plug 115U3, collectively referred to as an upper gate metal pattern, may also be formed of the same materials as those of the lower work-function metal layer 115L2 and the lower conductor plug 115L3 for the same purposes, respectively, with respect to the FinFET 100U. Thus, duplicate descriptions are omitted herein.

According to an embodiment, the nanosheet transistor 100L and the FinFET 100U may be formed as a p-type field-effect transistor (PFET) and an n-type field effect transistor (NFET) or vice versa, respectively, to provide complementary transistors in a complementary metal-oxide-semiconductor (CMOS) architecture. When the nanosheet transistor 100L and the FinFET 100U are formed as the same p-type or n-type field-effect transistor, the lower and upper work-function metal layers 115L2 and 115U2 may be formed of different materials, according to an embodiment. However, both the nanosheet transistor 100L and the FinFET 100U may be formed as the same one of the PFET and the NFET, according to an embodiment.

FIG. 1B shows that, in the lower and upper gate structures 115L and 115U of the present embodiment, the lower and upper work-function metal layer 115L2 and 115U2 are separated from each other, and the lower and upper conductor plug 115L3 and 115U3 are merged. However, the two work-function metal layers 115L2 and 115U2 may also be merged, or the two conductor plugs 115L3 and 115U3 may be separated from each other, at least depending on the threshold voltage Vt applied to the lower and upper gate structures 115L and 115U, or the types (p-type and n-type)

of field-effect transistors to be formed by the nanosheet transistor 100L and the FinFET 100U of the SG oxide multi-stack transistor 10.

The SG oxide multi-stack transistor 10 may further include an inner mask layer 102 that was used to pattern the fin structure 110U above the nanosheet stack 110L to form the SG oxide multi-stack transistor 10. According to an embodiment, the inner mask layer 102 may be left in the SG oxide multi-stack transistor 10 as shown in FIG. 1B, or may be removed in a separate process during a manufacturing process. The inner mask layer 102 may be formed of silicon nitride (SiN), not being limited thereto, in the present embodiment.

The SG oxide multi-stack transistor 10 may also include an interlayer dielectric (ILD) structure 125 isolating two adjacent structure elements such as the SG oxide multi-stack transistor 10 and an adjacent SG oxide multi-stack transistor or an adjacent EG oxide multi-stack transistor formed on one or more fin structure tracks on the same substrate 105. The ILD structure 125 may be formed of one or more low-κ dielectric materials such as silicon oxide (SiO), silicon oxynitride (SiON), not being limited thereto, according to an embodiment.

The SG oxide multi-stack transistor 10 may further include a lower spacer 116L, an inner spacer 117L and an upper spacer 116U that protect the lower and upper gate structures 115L and 115U from various processes such as etching, deposition, planarization, etc. performed to form adjacent structural elements such as the lower source/drain electrodes 120L, the upper source/drain electrodes 120U, and the ILD structure 125.

Now, referring to FIGS. 1A and 1D, the EG oxide multi-stack transistor 20 may also be formed on the substrate 105 where the SG oxide multi-stack transistor 10 is formed. The EG oxide multi-stack transistor 20 may include a nanosheet transistor 200L and a FinFET 200U formed on a lower stack and an upper stack of the EG oxide multi-stack transistor 20, respectively, according to an embodiment. The EG oxide multi-stack transistor 20 may also include an STI structure 206 to isolate the EG oxide multi-stack transistor 20 from adjacent EG oxide multi-stack transistors or adjacent SG oxide multi-stack transistors formed on one or more fin structure tracks on the same substrate 105.

In the EG oxide multi-stack transistor 20, the nanosheet transistor 200L may include a nanosheet stack 210L of a plurality nanosheet layers 210LN and a plurality intervening layers 210LS as a lower channel structure of the EG oxide multi-stack transistor 20, according to an embodiment. These intervening layers 210LS may be interposed between the nanosheet layers 210LN and between the lowermost nanosheet layer 210LNL among the nanosheet layers 210LN and the substrate 105, respectively. The intervening layers 210LS may be formed for a material or a material composition different from that of the nanosheet layers 210LN. Thus, the nanosheet stack 210L in the EG oxide multi-stack transistor 20 takes a form of zebra nanosheet structure. The nanosheet transistor 200L may also include a lower gate structure 215L and lower source/drain electrodes 220L for the EG oxide multi-stack transistor 20. The lower source/drain electrodes 220L may be epitaxially grown from the substrate 105 and the nanosheet layers 210LN.

It is noted here that the nanosheet stack 210L in the EG oxide multi-stack transistor 20 is different from the nanosheet stack 110L in the SG oxide multi-stack transistor 10 in that the nanosheet stack 210L includes not only the nanosheet layers 210LN but also the intervening layers 210LS to form a zebra nanosheet structure, as described above. In other words, according to the present embodiment, the intervening layers 210LS in addition to the nanosheet layers 210LN may function as the lower channel structure in the EG oxide multi-stack transistor 20, while in the SG oxide multi-stack transistor 10, only the nanosheet layers 110LN may function as the lower channel structure.

Like the nanosheet layers 110LN of the SG oxide multi-stack transistor 10, the nanosheet layers 210LN may be formed of silicon (Si) which is doped by adding p-type dopants or n-type dopants depending on a type of field-effect transistor to be formed. In contrast, the intervening layers 210LS may be formed of silicon germanium (SiGe), for example, SiGe 35% which indicates that the SiGe compound includes 35% of Ge and 65% of Si, not being limited thereto, according to an embodiment. As will be described later, before completed as the nanosheet transistor 100L, the nanosheet stack 110L of the SG oxide multi-stack transistor 10 also included a plurality intervening layers, like the intervening layers 210LS, interposed between the nanosheet layers 110LN and between the lowermost nanosheet layer 110LNL among the nanosheet layers 110LN and the substrate 105, respectively. However, these intervening layers of the nanosheet stack 110L have been removed during manufacturing of the SG oxide multi-stack transistor 10 as shown in FIGS. 1A to 1D. Thus, the intervening layers of the nanosheet stack 110L may be considered and referred to as sacrificial layers.

It is noted here that the nanosheet stack 210L of the nanosheet transistor 200L including the intervening layers 210LS formed between and below the nanosheet layers 210LN may still function as a current channel of the nanosheet transistor 200L in the EG oxide multi-stack transistor 20, even if the effective channel width $W_{\mathit{eff}}$ affecting the performance of the nanosheet transistor 200L may differ from the nanosheet stack 110L of the nanosheet transistor 100L in the SG oxide multi-stack transistor 10 that does not include the corresponding intervening layers. However, the manufacturing complexity and costs may be reduced in the present embodiment due to omission of removing the intervening layers 210LS as sacrificial layers in forming the lower gate structure 215L for the nanosheet transistor 200L as will be described later.

Although FIG. 1D shows that only two nanosheet layers and only two intervening layers form the nanosheet stack 210L in the EG oxide multi-stack transistor 20, the number of the nanosheet layers and the number of the intervening layers in the EG oxide multi-stack transistor 10 may not be limited to two, according to an embodiment. More or less than two nanosheet layers and more or less than two intervening layers may be formed to complete the nanosheet transistor 200L of the EG oxide multi-stack transistor 20, according to an embodiment.

Referring to FIGS. 1D and 1E, the lower gate structure 215L may include a lower EG oxide layer 215L0 surrounding the nanosheet stack 210L, a lower gate oxide layer 215L1 layered on the lower EG oxide layer 215L0, a lower work-function metal layer 215L2 formed on the lower gate oxide layer 215L1, and a lower conductor plug 215L3 formed on the lower work-function metal layer 215L2. The lower work-function metal layer 215L2 and the lower conductor plug 215L3 may also be collectedly referred to as a lower gate metal pattern of the EG oxide multi-stack transistor 20. The lower gate oxide layer 215L1 may also include an interfacial layer IL and a high-κ dielectric layer HK as the lower gate oxide layer 115L1 of the SG oxide multi-stack transistor 10 does, According to an embodiment, the lower EG oxide layer 215L0 may be formed of the same material forming the interfacial layer IL of the lower gate oxide layer 115L1, such as SiO, $SiO_2$ and/or SiON, not being limited thereto.

As described earlier in the Background section, the lower EG oxide layer 215L0 may be formed to prevent hard oxide breakdown in the lower gate structure 215L, and thus, enable the lower gate structure 215L to more reliably receive a gate input voltage for the nanosheet transistor 200L of the EG oxide multi-stack transistor 20.

The lower gate oxide layer 215L1 including the interfacial layer IL and the high-κ dielectric layer HK, the lower work-function metal layer 215L2, and the lower conductor plug 215L3 may be formed of the same materials forming the lower gate oxide layer 115L1, the lower work-function metal layer 215L2, and the lower conductor plug 115L3 of the nanosheet transistor 100L of the SG oxide multi-stack transistor 10 for the same purposes, respectively, with respect to the nanosheet transistor 200L of the EG oxide multi-stack transistor 20, according to an embodiment. Thus, duplicate descriptions are omitted herein.

As described above, the lower gate structure 215L of the nanosheet transistor 200L in the EG oxide multi-stack transistor 20 may include the lower EG oxide layer 215L0 which is an extra oxide layer in addition to the lower gate oxide layer 215L1, in the present embodiment. However, for the same purpose of providing a thick gate oxide layer, the lower gate oxide layer 215L1 may be formed to be thick, instead of forming the lower EG oxide layer 215L0 prior to forming the lower gate oxide layer 215L1, according to an embodiment, as shown in FIG. 1F. According to an embodiment, the lower gate oxide layer 215L1 may be formed to be thicker than the lower gate oxide layer 115L1 of the nanosheet transistor 100L of the SG oxide multi-stack transistor 10. In this case, the interfacial layer IL of the lower gate oxide layer 215L1 may be formed to be thicker than the interfacial layer IL of the lower gate oxide layer 115L1 of the SG oxide multi-stack transistor 10, according to an embodiment.

In the present embodiment, due to the intervening layers 210LS interposed between the nanosheet layers 210LN and between the lowermost nanosheet layer 210LNL among the nanosheet layers 210LN and the substrate 105, respectively, the lower EG oxide layer 215L0, the lower gate oxide layer 215L1 and the lower work-function metal layer 215L2 may not be formed between the nanosheet layers 210LN and between the lowermost nanosheet layer 210LNL among the nanosheet layers 210LN and the substrate 105 where the intervening layers 210LS are formed.

Referring back to FIGS. 1A and 1D, the EG oxide multi-stack transistor 20 may also include the FinFET 200U formed above the nanosheet transistor 200L. The FinFET 200U may include a fin structure 210U as an upper channel structure of the EG oxide multi-stack transistor 20, an upper gate structure 215U surrounding the fin structure 210U, and upper source/drain electrodes 220U for the EG oxide multi-stack transistor 10. The upper source/drain electrodes 220U may be epitaxially grown from the fin structure 210U.

The structure and materials of the fin structure 210U of the FinFET 200U may be the same as the fin structure 110U of the FinFET 100U of the SG oxide multi-stack transistor 10, and thus, duplicate descriptions are omitted herein. Further, although the FinFET 200U, like the FinFET 100U, includes only one fin structure in the EG oxide multi-stack transistor 20 and top, bottom and side surfaces thereof are surrounded by the upper gate structure 215U as shown in FIGS. 1A and 1D, two or more fin structures may be formed above the nanosheet transistor 200L to form the FinFET 200U and only the top and side surfaces of the fin structure 210U may be surrounded by the upper gate structure 215U, according to embodiments.

Referring to FIGS. 1D and 1E, the upper gate structure 215U may include an upper EG oxide layer 215U0 surrounding the fin structure 210U, an upper gate oxide layer 215U1 layered on the upper EG oxide layer 215U0, an upper work-function metal layer 215U2 formed on the upper gate oxide layer 215U1, and an upper conductor plug 215U3 formed on the upper work-function metal layer 215U2. The upper work-function metal layer 215U2 and the upper conductor plug 215U3 may also be collectively referred to as an upper gate metal pattern of the EG oxide multi-stack transistor 20.

The upper gate oxide layer 215U1 may also include an interfacial layer IL and a high-κ dielectric layer HK in the present embodiment. The upper gate oxide layer 215U1, the upper work-function metal layer 215U2, and the upper conductor plug 215U3 may be formed of the same materials forming the upper gate oxide layer 115U1, the upper work-function metal layer 115U2, and the upper conductor plug 115U3 of the upper gate structure 115U of the SG oxide multi-stack transistor 10 for the same purposes, respectively, with respect to the upper gate structure 215U of the EG oxide multi-stack transistor 20, according to an embodiment. Thus, duplicate descriptions are omitted herein.

According to an embodiment, the upper EG oxide layer 215U0 may be formed of the same material forming the interfacial layer IL of the upper gate oxide layer 115U1 or the lower EG oxide layer 215L0, that is, SiO, $SiO_2$, SiON, etc., not being limited thereto.

As described above, the upper EG oxide layer 215U0 of the FinFET 200U, like the lower EG oxide layer 215L0 of the nanosheet transistor 200L, may also be formed to prevent hard oxide breakdown in the upper gate structure 215U, and thus, enable the upper gate structure 215U to more reliably receive a gate input voltage for the FinFET 200U of the EG oxide multi-stack transistor 20. However, for the same purpose of providing a thick gate oxide layer, the upper gate oxide layer 215U1 may be formed to be thicker than the upper gate oxide layer 115U1 of the FinFET 100U of the SG oxide multi-stack transistor 10 as shown in FIG. 1F, instead of forming the upper EG oxide layer 215U0 in the upper gate oxide layer 215U1, according to an embodiment. In this case, the interfacial layer IL of the upper gate oxide layer 215U1 may be formed to be thicker than the interfacial layer IL of the upper gate oxide layer 115U1 of the SG oxide multi-stack transistor 10.

According to an embodiment, the nanosheet transistor 200L and the FinFET 200U may be formed as a PFET and an NFET or vice versa, respectively, to provide complementary transistors in a complementary metal-oxide-semiconductor (CMOS) architecture. When the nanosheet transistor 200L and the FinFET 200U are formed as the same p-type or n-type field-effect transistor, the lower and upper work-function metal layers 215L2 and 215U2 may be formed of different materials, according to an embodiment. However, both the FinFET 200U and the nanosheet transistor 200L may be formed as the same one of the PFET and the NFET, according to an embodiment.

FIG. 1D shows that, in the lower and upper gate structures 215L and 215U of the present embodiment, the lower and upper work-function metal layer 215L2 and 215U2 are merged, and the lower and upper conductor plugs 215L3 and 215U3 are also merged. However, the two work-function metal layers 215L2 and 215U2 may be separated from each other, or the two conductor plugs 215L3 and 215U3 may be separated from each other, at least depending on the threshold voltage Vt applied to the lower and upper gate structures 215L and 215U, or the type (p-type and n-type) of field-effect transistors to be formed by the nanosheet transistor 200L and the FinFET 200U of the EG oxide multi-stack transistor 20.

The EG oxide multi-stack transistor 20 may further include an inner mask layer 202 that was used to pattern the fin structure 210U above the nanosheet stack 210L to form the EG oxide multi-stack transistor 20. According to an embodiment, the inner mask layer 202 may be left in the EG oxide multi-stack transistor 20 as shown in FIG. 1D, or may be removed in a separate process during a manufacturing process. The inner mask layer 202 may also be formed of SiN, not being limited thereto, in the present embodiment.

The EG oxide multi-stack transistor 20 may also include an ILD structure 225 isolating two adjacent structure elements such as the EG oxide multi-stack transistor 20 and an adjacent EG oxide multi-stack transistor or an adjacent SG oxide multi-stack transistor formed on one or more fin structure tracks on the same substrate 105. The ILD structure 225 may also be formed of one or more low-κ dielectric materials such as SiO, SiON, not being limited thereto, according to an embodiment.

The EG oxide multi-stack transistor 20 may further include a lower spacer 216L, an inner spacer 217L and an upper spacer 216U that protect the lower and upper gate structures 215L and 215U from various processes such as etching, deposition, planarization, etc. performed to form adjacent structural elements such as the lower source/drain electrodes 220L, the upper source/drain electrodes 220U, and the ILD structure 225.

According to the above embodiments, an SG oxide multi-stack transistor includes a nanosheet transistor and a FinFET above the nanosheet transistor on a substrate, and an EG oxide multi-stack transistor includes a zebra nanosheet transistor with a lower EG oxide layer and a FinFET with an upper EG oxide layer on the zebra nanosheet transistor. However, according to an embodiment, an SG oxide multi-stack transistor may be formed to include two or more nanosheet transistors at two or more lower stacks and a FinFET at an upper stack, and an EG oxide multi-stack transistor may be formed to include two or more zebra nanosheet transistors with respective lower EG oxide layers and a FinFET with an upper EG oxide layer.

Further, the above embodiments provide an SG oxide multi-stack transistor including a nanosheet transistor and a FinFET at lower and upper stacks, respectively, and an EG oxide multi-stack transistor including a zebra nanosheet transistor and a FinFET with EG oxide layers at lower and upper stacks, respectively. However, according to an embodiment, an SG oxide multi-stack transistor may be formed to include lower and upper nanosheet transistors at lower and upper stacks, respectively, and the EG oxide multi-stack transistor may be formed to include lower and upper zebra nanosheet transistors with EG oxide layers at lower and upper stacks, respectively, as described below.

FIG. 1G illustrates an SG oxide multi-stack nanosheet transistor and an EG oxide multi-stack nanosheet transistor of a multi-stack semiconductor device, respectively, formed on a substrate, according to an embodiment.

Referring to FIG. 1G, an SG oxide multi-stack transistor 30 may include lower and upper nanosheet transistors 300L and 300U on a substrate 305. The lower and upper nanosheet transistors 300L and 300U may include a plurality lower and upper nanosheet layers 310LN and 310UN as lower and upper channel structures of the SG oxide multi-stack transistor 30, respectively. The lower and upper nanosheet layers 310LN and 310UN may be surrounded by lower and upper gate structures 315L and 315U, respectively. The lower and upper gate structures 315L and 315U may include lower and upper gate oxide layers 315L1 and 315U1, lower and upper work-function metal layers 315L2 and 315U2, and lower and upper conductor plugs 315L3 and 315U3, respectively.

Referring to FIG. 1G again, an EG oxide multi-stack transistor 40 may include lower and zebra nanosheet transistors 400L and 400U. The lower and upper zebra nanosheet transistors 400L and 400U may include lower and upper zebra stacks 410L and 410U as the lower and upper channel structures of the EG oxide multi-stack transistor 40, respectively. The lower zebra stack 410L may include a plurality lower intervening layers 410LS and a plurality lower nanosheet layers 410LN interposed between the lower intervening layers 410LS and the substrate 305. The upper zebra stack 410U may include a plurality upper intervening layers 410US and a plurality upper nanosheet layers 410UN interposed between the upper intervening layers 410US. The lower and upper zebra stacks 410L and 410U may be surrounded by lower and upper gate structures 415L and 415U, respectively. The lower and upper gate structures 415L and 415U may include lower and upper EG oxide layers 415L0 and 415U0, lower and upper gate oxide layers 415L1 and 415U1, lower and upper work-function metal layers 415L2 and 415U2, and lower and upper conductor plugs 415L3 and 415U3, respectively.

It is noted in the EG oxide multi-stack transistor 40 shown in FIG. 1F, the lower and upper zebra stacks 410L and 410U may be used as the lower and upper channel structures of the EG oxide multi-stack transistor 40, respectively, although the lower and upper zebra stacks 410L and 410U include the lower and upper intervening layers 410LS and 410US not included in the SG oxide multi-stack transistor 30. As the lower and upper channel structures of the EG oxide multi-stack transistor 40 are formed to include the lower and upper intervening layers 410LS and the 410US, respectively, the lower and upper gate structures 415L and 415U may not be formed between the lower and upper nanosheet layers 410LN and 410UN, respectively.

It is also noted that the lower and upper zebra nanosheet transistors 400L and 400U may include the lower and upper EG oxide layers 410L0 and 410U0 to more reliably receive gate input voltages.

FIG. 1G shows that the upper nanosheet stacks 310U and 410U have more nanosheet layers of which a width is smaller than the lower nanosheet stacks 310L and 410L in the present embodiment. However, the number and the width of nanosheet layers may be differently designed depending on the use of the nanosheet transistors in a logic circuit, according to embodiments.

According to an embodiment, the EG oxide multi-stack transistor 40 may be formed such that, instead of including the lower and upper EG oxide layers 415L0 and 415U0 in the lower and upper gate structures 415L and 415U, respectively, the lower and upper gate oxide layers 415L1 and 415U1 may be formed to be thicker than the lower and upper gate oxide layers 315L1 and 315U1 of the SG oxide multi-stack transistor 30.

FIGS. 2A to 2I illustrate a method of manufacturing a multi-stack semiconductor device in reference to FIGS. 1A to 1E, according to embodiments.

It is understood that the method of manufacturing the multi-stack semiconductor device according to the present embodiments is described in reference to cross-sectional views taken the lines X1-X1' and I1-I1' shown in FIGS. 1A-1B.

Figure 2A:
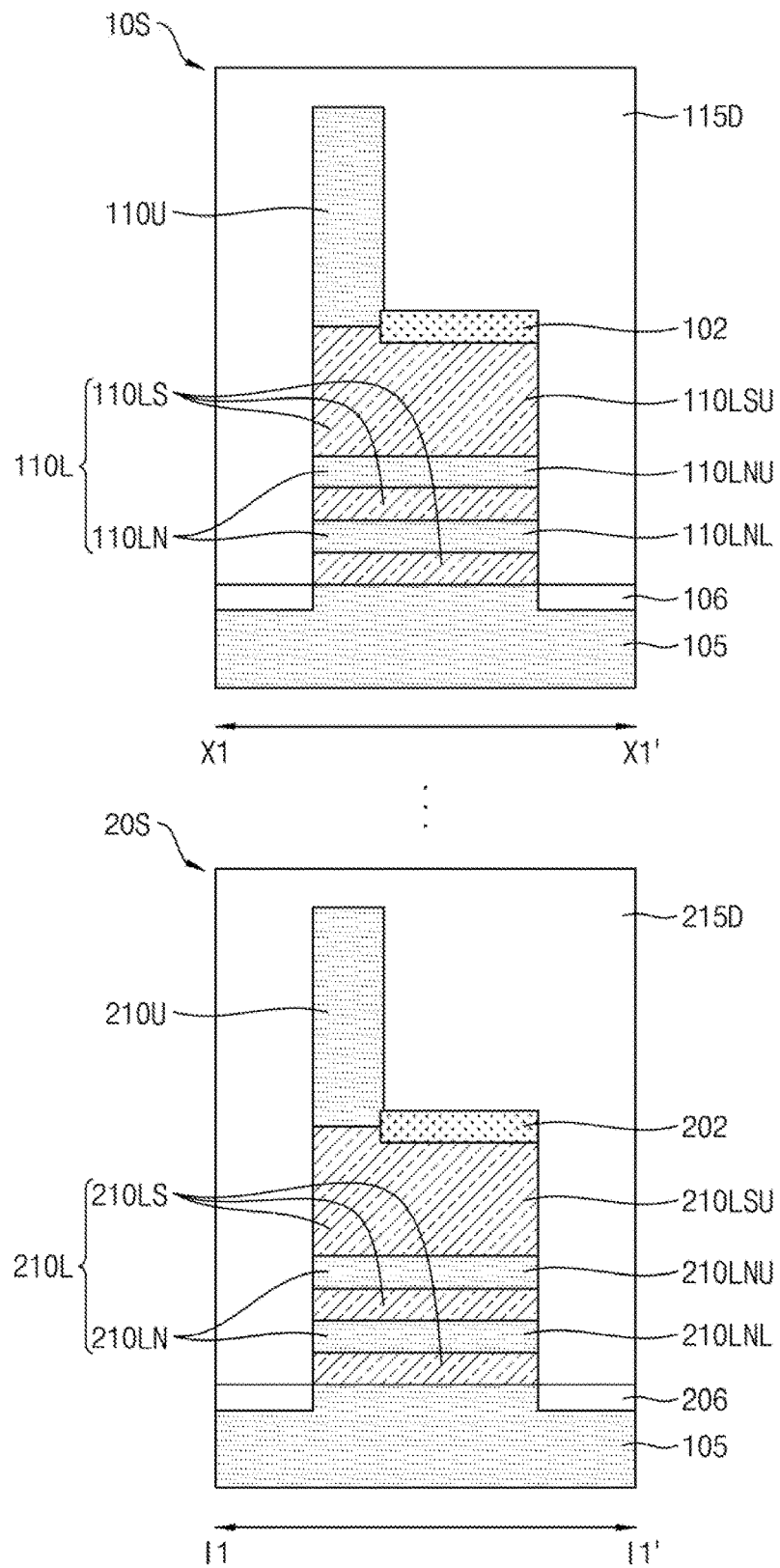

Referring to FIG. 2A, a $1^{st}$ multi-stack semiconductor structure 10S and a $2^{nd}$ multi-stack semiconductor structure 20S are provided on the same substrate 105 to form the SG oxide multi-stack transistor 10 and the EG oxide multi-stack transistor 20, respectively, shown in FIGS. 1A to 1E.

Although not shown by drawings, the $1^{st}$ multi-stack semiconductor structure 10S shown in FIG. 2A may be formed by epitaxially growing the intervening layers 110LS and nanosheet layers 110LN from the substrate 105 to desired thicknesses in an alternating manner. Then, the fin structure 110U and the nanosheet stack 110L may be patterned using known techniques such as dry etching, not being limited thereto, based on the inner mask layer 102 deposited on a portion of the uppermost intervening layer 110LSU among the intervening layers 110LS. The uppermost intervening layer 110LSU is formed on the uppermost nanosheet layer 110LNU.

As shown in FIG. 2A, the fin structure 110U of the $1^{st}$ multi-stack semiconductor structure 10S may be patterned on a region of the uppermost intervening layer 110LSU, where the inner mask layer 102 is not deposited, to have a vertical pillar form. Although FIG. 2A shows only one fin structure patterned above the nanosheet stack 110L, more than one fin structure may be patterned, according to an embodiment. The STI structure 106 may be formed at sides of the nanosheet stack 110L in the same substrate 105.

In the same manner and at the same time, the $2^{nd}$ multi-stack semiconductor structure 20S may be formed on the same substrate 105 to have the nanosheet stack 210L including the nanosheet layers 210LN and the intervening layers 210LS, the inner mask layer 202, the fin structure 210U, and the STI structure 206.

Here, the nanosheet layers 110LN may be formed of Si, and the intervening layers 110LS may be formed of SiGe, for example, SiGe 35% which indicates that the SiGe compound includes 35% of Ge and 65% of Si, not being limited thereto, according to an embodiment After the $1^{st}$ and $2^{nd}$ multi-stack semiconductor structures 10S and 20S are formed on the substrate 105 as described above, $1^{st}$ and $2^{nd}$ dummy gate structures 115D and 215D may be formed on the $1^{st}$ and $2^{nd}$ multi-stack semiconductor structures 10S and 20S, respectively, using known techniques such as lithography, chemical vapor deposition (CVD), flowable CVD (FCVD), dry etching, planarization, etc., not being limited thereto. The $1^{st}$ and $2^{nd}$ dummy gate structures 115D and 215D may be formed of the same material(s), for example, polycrystalline silicon (poly-Si) or amorphous silicon (a-Si), not being limited thereto, at the same time, according to an embodiment.

Although not shown in FIG. 2A, the lower source/drain electrodes 120L and 220L, the upper source/drain electrodes 120U and 220U, the ILD structures 125 and 225, the lower spacers 116L and 216L, the inner spacers 117L and 217L, and the upper spacers 116U and 216 may also be formed before or after the $1^{st}$ and $2^{nd}$ dummy gate structures 115D and 215D may be formed on the $1^{st}$ and $2^{nd}$ multi-stack semiconductor structures 10S and 20S, respectively, through known techniques. For the formation of these structures, the $1^{st}$ and $2^{nd}$ dummy gate structures 115D and 215D may be used as mask structures.

Referring to FIG. 2B, a top mask layer 103 may be deposited on the $1^{st}$ multi-stack semiconductor structure 10S to protect the $1^{st}$ multi-stack semiconductor structure 10S from subsequent processes performed on the $2^{nd}$ multi-stack semiconductor structure 20S. The top mask layer 103 may be formed of the same material as the inner mask layer 102, for example, SiN.

Figure 2C:
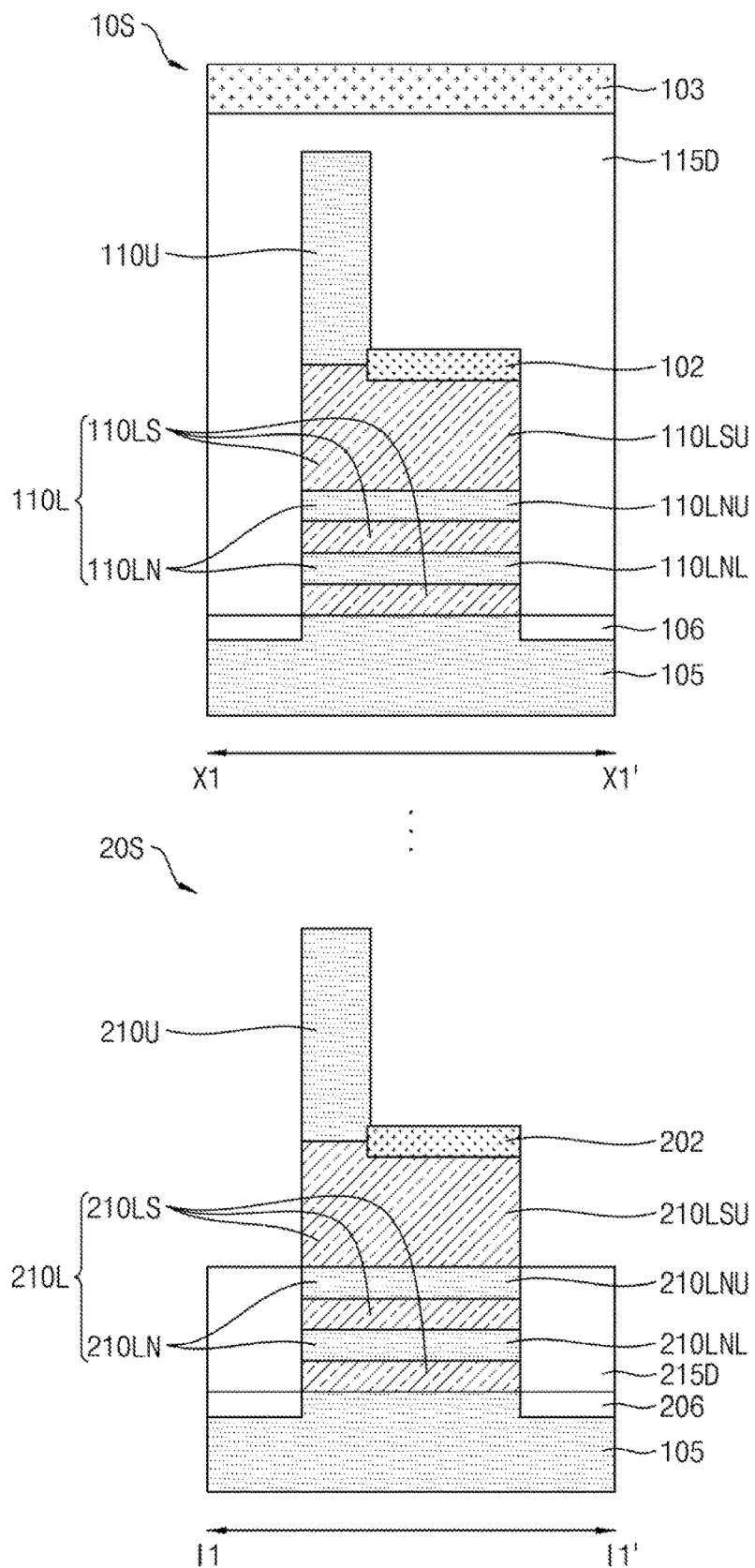

Referring to FIG. 2C, with the $1^{st}$ multi-stack semiconductor structure 10S being covered by the top mask layer 103, an upper portion of the $2^{nd}$ dummy gate structure 215D above a level of a top surface of the uppermost nanosheet layer 210LNU among the nanosheet layers 210LN may be removed leaving a lower portion of the $2^{nd}$ dummy gate structure 215D at or below the level of the top surface of the uppermost nanosheet layer 210LNU in the $2^{nd}$ multi-stack semiconductor structure 20S. This removal operation may expose top and side surfaces of the fin structure 210U, a top surface and a side surface of the inner mask layer 202, and side surfaces of the uppermost intervening layer 210LSU, as shown in FIG. 2B.

Here, the removal of the upper portion of the $2^{nd}$ dummy gate structure 215D may be performed by known techniques such as dry etching, wet etching, reactive ion etching (RIE) and/or a chemical oxide removal (COR) process, not being limited thereto.

For the foregoing removal operation, the upper portion and the lower portion of the $2^{nd}$ dummy gate structure 215D may have been formed of different materials having different etch selectivity, according to an embodiment. Alternatively, an etch stop layer (or a corresponding structure) (not shown) may have been layered at the level of the top surface of the uppermost nanosheet layer 210LNU when the $2^{nd}$ dummy gate structure 215D was deposited so that the removal of the $2^{nd}$ dummy gate structure 215D in this operation stops at this level above the substrate 105, according to an embodiment. In this case, after removing the $2^{nd}$ dummy gate structure 215D, the etch stop layer may also be removed by the same or different techniques used to remove the $2^{nd}$ dummy gate structure 215D (not shown).

Figure 2D:
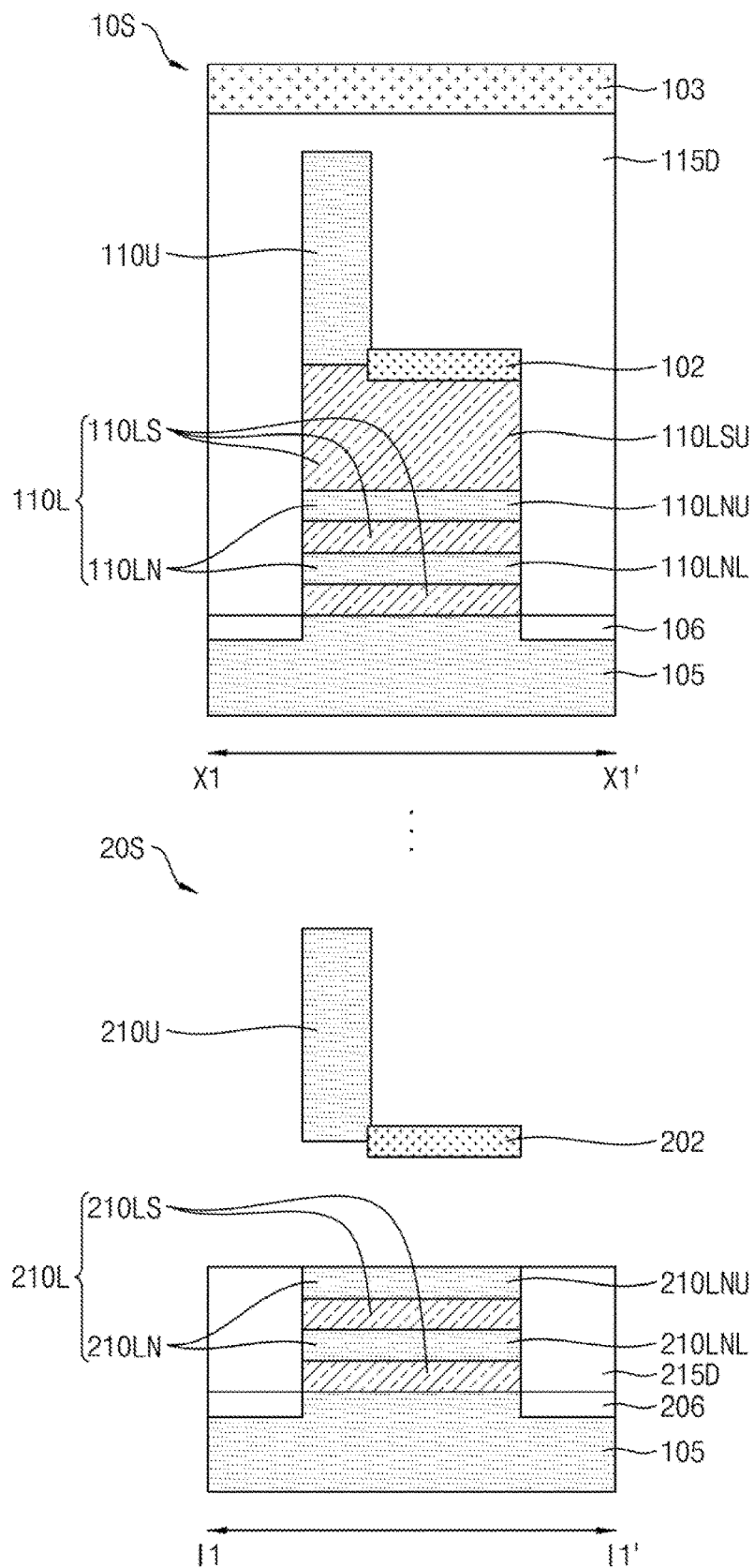

Referring to FIG. 2D, the uppermost intervening layer 210LSU may be removed using the lower portion of the $2^{nd}$ dummy gate structure 215D as a mask structure masking the remaining intervening layers 210LS (other than the uppermost intervening layer 210LSU). Here, the uppermost intervening layer 210LSU may be removed using known techniques similar to those used to remove the upper portion of the $2^{nd}$ dummy gate structure 215D in the operation of FIG. 2C, in the present embodiment. When the etch stop layer was used as described above, the etch stop layer may be used as the mask structure to protect the remaining intervening layers 210LS when the uppermost intervening layer 210LSU is removed, according to an embodiment.

As the uppermost intervening layer 210LSU is removed in this operation, the nanosheet stack 210L may be separated from the fin structure 210U, and the top surface of the uppermost nanosheet layer 210LNU and bottom surfaces of the fin structure 210U and the inner mask layer 202 may be exposed in the $2^{nd}$ multi-stack semiconductor structure 20S, as shown in FIG. 2D.

Figure 2E:
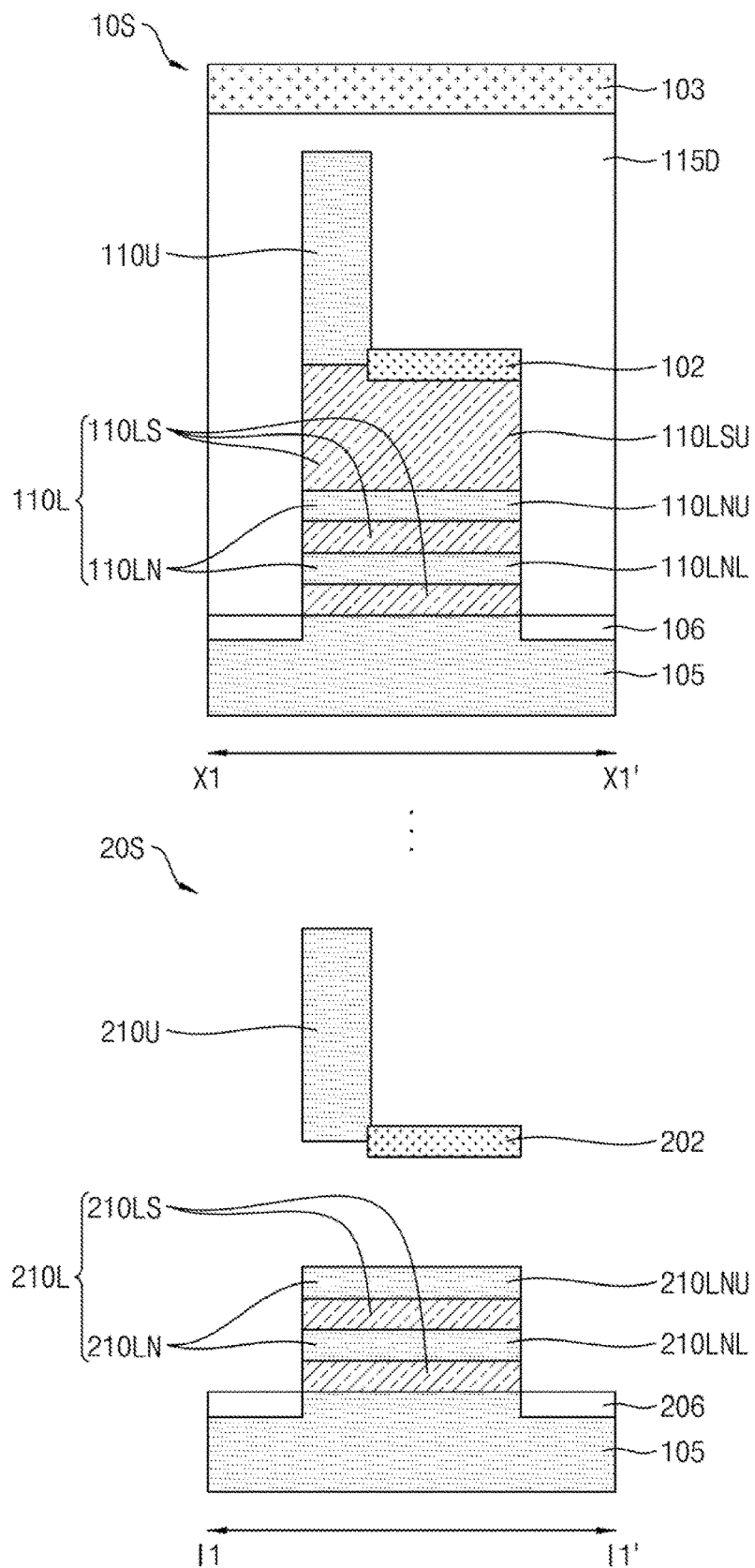

Referring to FIG. 2E, the lower portion of the $2^{nd}$ dummy gate structure 215D below the top surface of the uppermost nanosheet layer 210LNU may be removed using the same techniques used in the removal operation of FIG. 2C, according to an embodiment. This removal operation exposes the nanosheet stack 210L including the nanosheet layers 210LN and the intervening layers 210LS except the removed uppermost intervening layer 210LSU, as shown in FIG. 2E. Thus, the nanosheet stack 210L in the $2^{nd}$ multi-stack semiconductor structure 20S may take a form of a zebra nanosheet structure which includes the nanosheet layers 210LN and the intervening layers 210LS, except the uppermost intervening layer 210LSU, as an upper channel structure of the EG oxide multi-stack transistor 20 to be formed from the $2^{nd}$ multi-stack semiconductor structure 20S.

As a result of the foregoing removal operations, substantially all surfaces of the fin structure 210U, the inner mask layer 202, and the nanosheet stack 210L except a bottom surface of the nanosheet stack 210L facing the substrate 105 are exposed.

Referring to FIG. 2F, the lower EG oxide layer 215L0 may be conformally layered along the exposed surfaces of the nanosheet stack 210L to a desired thickness using known techniques such as atomic layer deposition (ALD), not being limited thereto, according to an embodiment. Here, the desired thickness of the lower EG oxide layer 215L0 may range approximately 4 nm to 5 nm, according to an embodiment.

When the lower EG oxide layer 215L0 is deposited, the lower EG oxide layer 215L0 may be extended along a top surface of the STI structure 206 as shown in FIG. 2F in the present embodiment. However, this extended portion of the lower EG oxide layer 215L0 may not be necessary to form the EG oxide multi-stack transistor 20, and thus, may be removed by known techniques, according to an embodiment. Further, an additional process of removing the inner mask layer 202 from the $2^{nd}$ multi-stack semiconductor structure 20S may be performed using known techniques, although not shown in a separate drawing, according to an embodiment.

Substantially at the same time of deposing the lower EG oxide layer 215L0 on the nanosheet stack 210L, the upper EG oxide layer 215U0 may also be deposited on the exposed surfaces of the fin structure 210U and the inner mask layer 202 to the same or similar thickness, according to an embodiment.

The lower and upper EG oxide layers 215L0 and 215U0 may be formed of one or more materials selected from SiO, $SiO_2$, SiON, etc., not being limited thereto, according to an embodiment. As described earlier, the lower and upper EG oxide layers 215L0 and 215U0 are included in the lower and upper gate structures 215L and 215U, respectively, of only the $2^{nd}$ multi-stack semiconductor structure 20S in order to form the EG oxide multi-stack transistor 20 in which a gate input voltage is more reliable received.

Figure 2G:
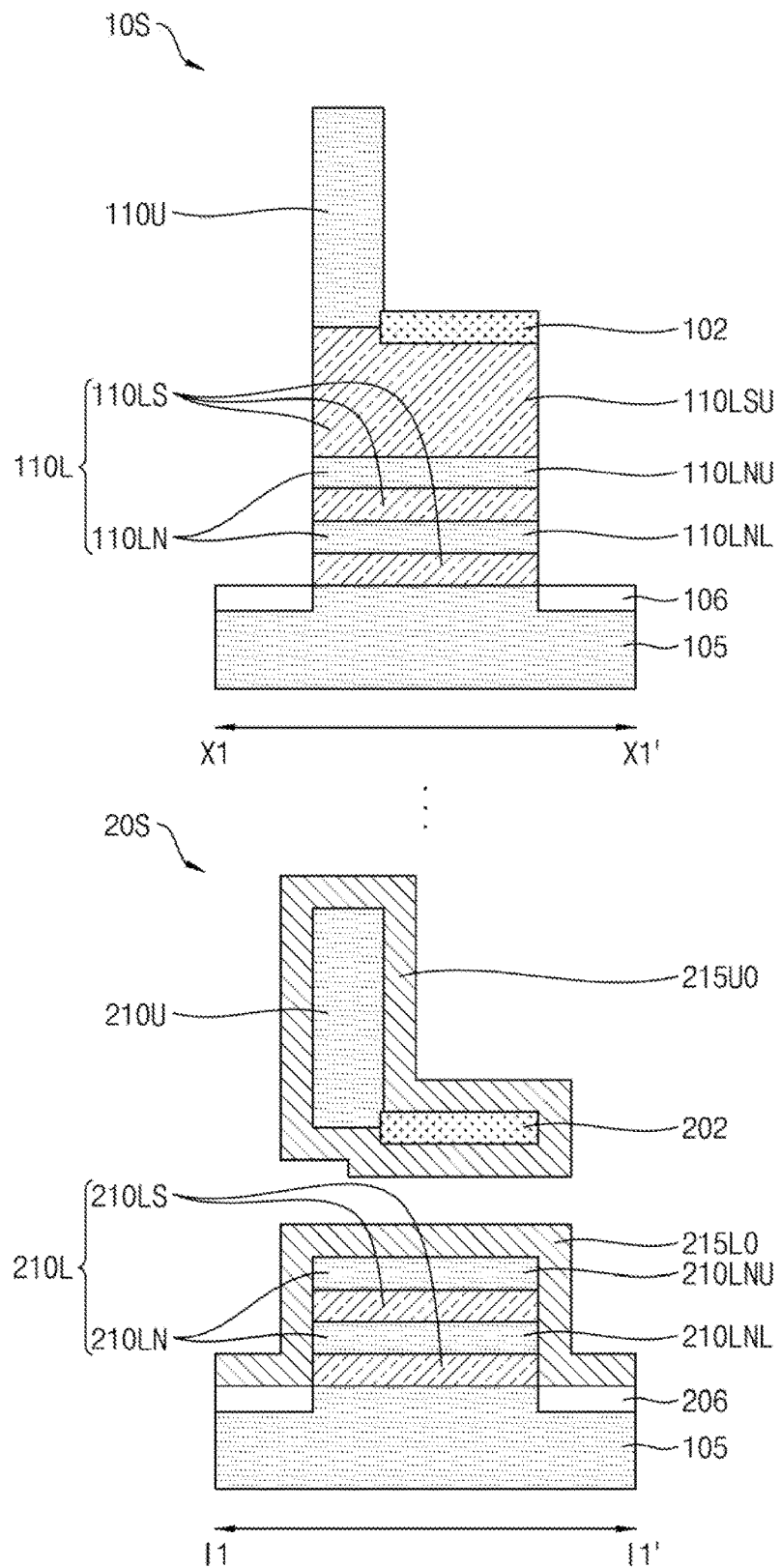

Referring to FIG. 2G, the top mask layer 103 deposited on the $1^{st}$ multi-stack semiconductor structure 10S may be removed to expose the $1^{st}$ multi-stack semiconductor structure 10S, on which the $1^{st}$ dummy gate structure 115D is formed, on the substrate 105.

Subsequently, the $1^{st}$ dummy gate structure 115D may be removed in its entirety from the $1^{st}$ multi-stack semiconductor structure 10S using the same techniques used to remove the $2^{nd}$ dummy gate structure 215D in the previous operations.

Figure 2H:
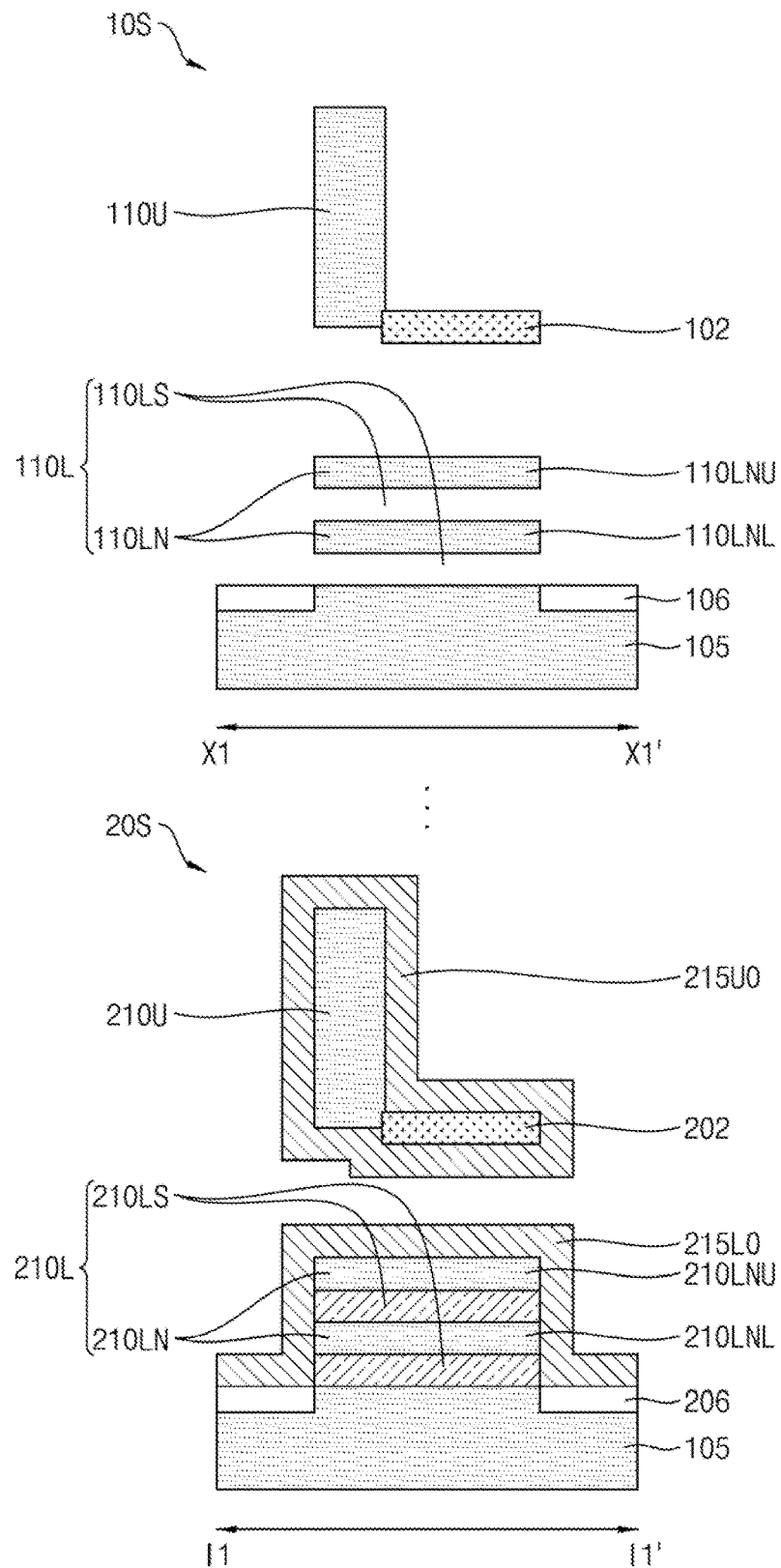
Figure 21:
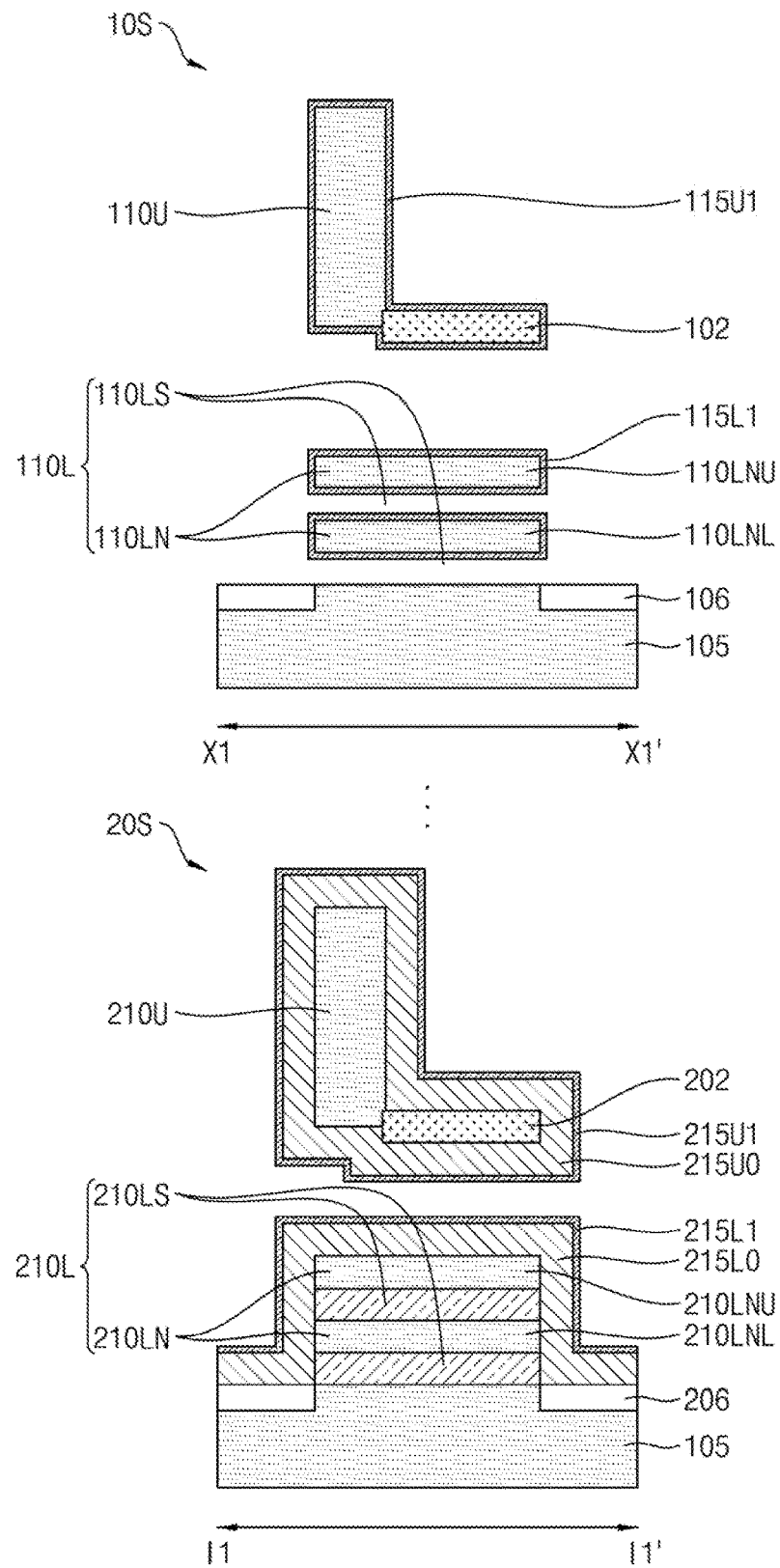

Referring to FIG. 2H, the intervening layers 110LS may be removed as sacrificial layers in their entireties from the $1^{st}$ multi-stack semiconductor structure 10S to expose substantially all surfaces of the fin structure 110U, the inner mask layer 102, and the nanosheet layers 110LN. Further exposed is a top surface of the substrate 105 below the nanosheet stack 110L and a top surface of the STI structure 106. As the intervening layers 110LS are removed, the nanosheet stack 110L in the $1^{st}$ multi-stack semiconductor structure 10S includes only the nanosheet layers 110LN as a lower channel structure for the SG oxide multi-stack transistor 10 to be formed from the multi-stack semiconductor structure 10S, unlike the nanosheet stack 210L in the $2^{nd}$ multi-stack semiconductor structure 20S described in FIG. 2E The removal operation here may be performed using the same known techniques used to remove the uppermost intervening layer 210LSU in the previous operation shown in FIG. 2D.

Referring to FIG. 2I, the lower and upper gate oxide layers 215L1 and 215U1, including corresponding interfacial layers IL and high-κ layers HK, may be conformally deposited to desired thicknesses along outer surfaces of the lower and upper EG oxide layers 215L0 and 215U0, in the $2^{nd}$ multi-stack semiconductor structure 20S. At the same time, the lower and upper gate oxide layers 115L2 and 115U2, including corresponding interfacial layers IL and high-κ layers HK, may be conformally deposited to desired thicknesses along the exposed surfaces of the nanosheet layers 110LN, the fin structure 110U and the inner mask layer 102, in the $1^{st}$ multi-stack semiconductor structure 10S. Each of the lower and upper gate oxide layers 215L2 and 215U2 including the corresponding interfacial layers IL and high-κ layers HK may range 2 nm to 3 nm in the present embodiment.

Here, the corresponding interfacial layers IL of the lower and upper gate oxide layers 115L2 and 115U2 may be formed of the same material(s) forming the lower and upper EG oxide layers 215L0 and 215U0.

Figure 2J:
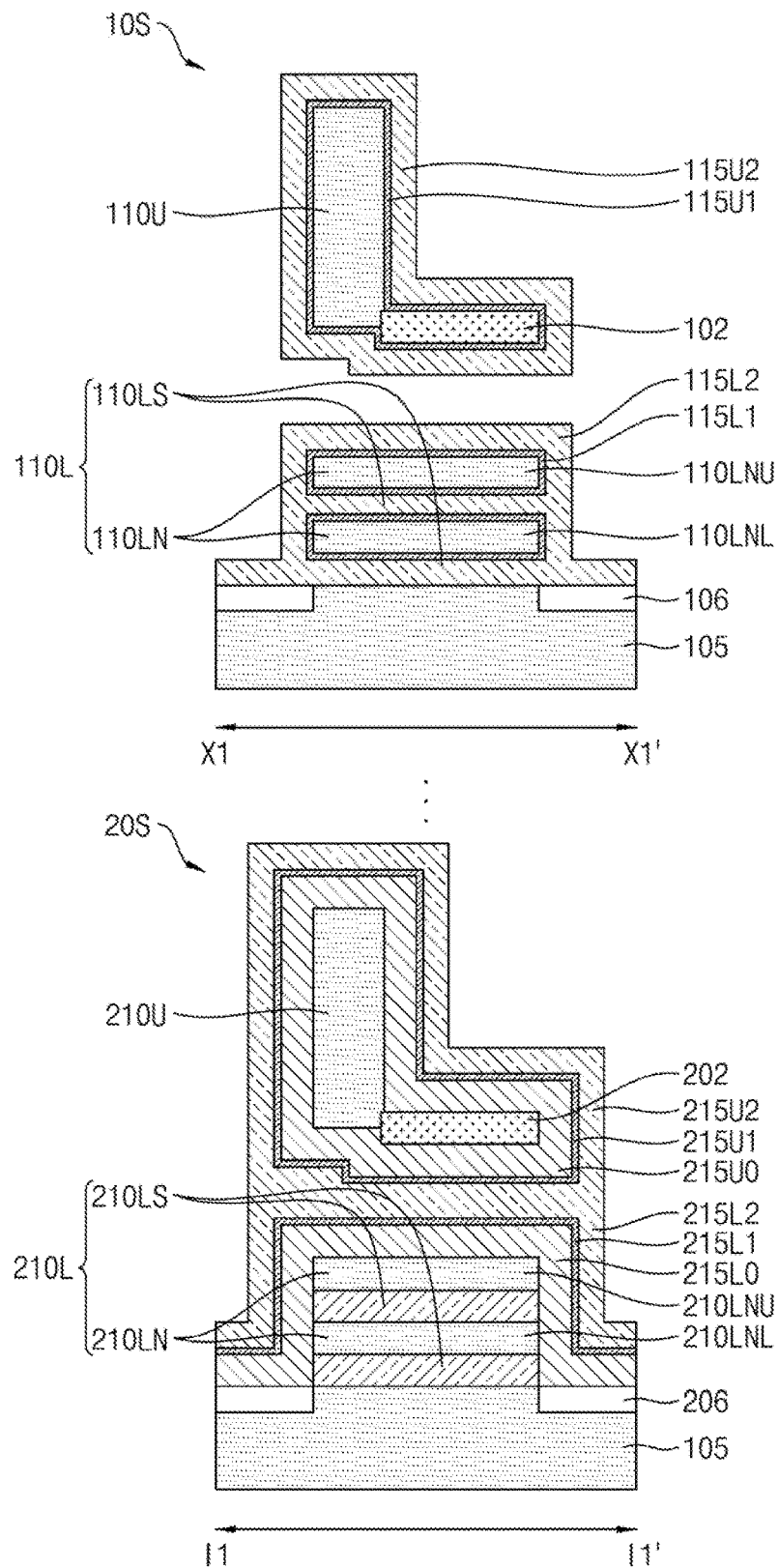

Referring to FIG. 2J, the lower and upper work-function metal layers 215L2 and 215U2 may be formed on outer surfaces of the lower and upper gate oxide layers 215L1 and 215U1, respectively, in the $2^{nd}$ multi-stack semiconductor structure 20S using known techniques such as CVD, FCVD and ALD, not being limited thereto. Here, the lower and upper work-function metal layers 215L2 and 215U2 may be formed on outer surfaces of the corresponding high-κ layers of the lower and upper gate oxide layers 215L1 and 215U1 in the $2^{nd}$ multi-stack semiconductor device.

At the same time, in the $1^{st}$ multi-stack semiconductor structure 10S, the lower and upper work-function metal layers 115L2 and 115U2 may also be formed on outer surfaces of the lower and upper gate oxide layers 115L1 and 115U1 using the same or similar techniques used in forming the lower and upper work-function metal layers 215L2 and 215U2. Here, the lower and upper work-function metal layers 115L2 and 115U2 may be formed on outer surfaces of the corresponding high-κ layers of the lower and upper gate oxide layers 115L1 and 115U1, in the $1^{st}$ multi-stack semiconductor device.

FIG. 2J shows that the lower and upper work-function metal layers 215L2 and 215U2 are merged, while the lower and upper work-function metal layers 115L2 and 115U2 are isolated from each other. However, according to embodiments, the lower and upper work-function metal layers 215L2 and 215U2 may be separated from each other, and the lower and upper work-function metal layers 115L2 and 115U2 may be merged. These structures of the work-function metal layers in each of the $1^{st}$ and $2^{nd}$ multi-stack semiconductor structures 10S and 20S may be determined considering gate threshold voltages Vt and types of field-effect transistors to be formed from the $1^{st}$ and $2^{nd}$ multi-stack semiconductor structures 10S and 20S.

The work-function metal layers 115L2, 115U2, 215L2 and 215U2 may be formed of Ti, Ta or their compound such as TiN, TiAl, TiAlN, TaN, TiC, TaC, TiAlC, TaCN, TaSiN, and/or a combination thereof, not being limited thereto, according to an embodiment. However, the material(s) forming these work-function metal layers 115L2, 115U2, 215L2 and 215U2 may be different from one another depending on the gate threshold voltages Vt and the types of field-effect transistors to be formed from the $1^{st}$ and $2^{nd}$ multi-stack semiconductor structures 10S and 20S, according to an embodiment.

Referring to FIG. 2K, the lower and upper conductor plugs 215L3 and 215U3 may be formed on the lower and upper work-function metal layers 215L2 and 215U2, respectively, in the $2^{nd}$ multi-stack semiconductor structure 20S using known techniques such as CVD, FCVD and ALD, not being limited thereto. The lower and upper conductor plugs 215L3 and 215U3 may be formed of Cu, Al, W, Mo or their compound, not being limited thereto, to receive an input voltage of corresponding field-effect transistors formed in the $2^{nd}$ multi-stack semiconductor structure 20S or for an internal routing of these field-effect transistors to an adjacent circuit in the multi-stack semiconductor structure to be manufactured in the present embodiments.

At the same time, the lower and upper conductor plugs 115L3 and 115U3 may also be formed on the lower and upper work-function metal layers 115L2 and 115U2 using the same or similar techniques used in forming the lower and upper conductor plugs 215L3 and 215U3. The lower and upper conductor plugs 115L3 and 115U3 may be formed of the same materials forming the lower and upper conductor plugs 215L3 and 215U3 for the same purposes.

Accordingly, the $1^{st}$ and $2^{nd}$ multi-stack semiconductor structures 10S and 20S may be completed as the SG oxide multi-stack transistor 10 and the EG oxide multi-stack transistor 20, respectively, shown in FIGS. 1A to 1E.

Although FIGS. 2A-2K show a method of manufacturing only one SG oxide multi-stack transistor and only one EG oxide multi-stack transistor, the method may apply to manufacturing a plurality SG oxide multi-stack transistors and a plurality EG oxide multi-stack transistors on a plurality fin structure tracks on a same substrate.

Figure 3:
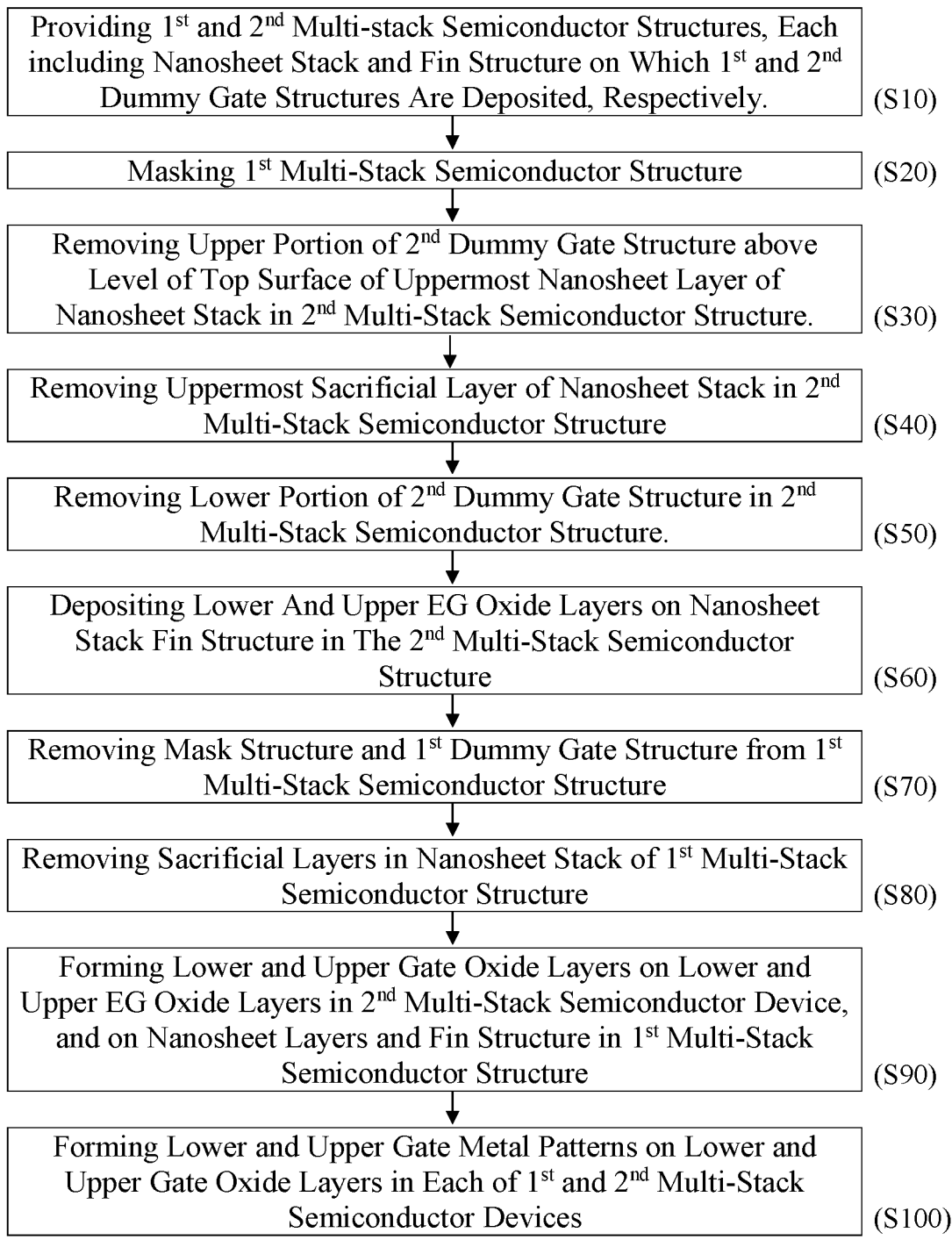
FIG. 3 illustrates a flowchart describing a method of manufacturing a multi-stack semiconductor device in reference to FIGS. 1A to 1F and 2A to 2K, according to an embodiment.

FIG. 3 illustrates a flowchart describing a method of manufacturing a multi-stack semiconductor device in reference to FIGS. 1A to 1F and 2A to 2K, according to an embodiment.

In operation S10 (FIG. 2A), $1^{st}$ and $2^{nd}$ multi-stack semiconductor structures may be provided on a substrate. Each of the $1^{st}$ and $2^{nd}$ multi-stack semiconductor structures may include a nanosheet stack and at least one fin structure above the nanosheet stack on which $1^{st}$ and $2^{nd}$ dummy gate structures are deposited, respectively. The nanosheet stack may include a plurality intervening layers and a plurality nanosheet layers interposed between the intervening layers on the substrate. The fin structure above the nanosheet stack may be formed on the uppermost intervening layer among the intervening layers.

In operation S20 (FIG. 2B), the $1^{st}$ multi-stack semiconductor structure may be masked by a mask structure to protect the multi-stack semiconductor structure from various operations performed on the $2^{nd}$ multi-stack semiconductor structure.

In operations S30 (FIG. 2C), an upper portion of the $2^{nd}$ dummy gate structure in the $2^{nd}$ multi-stack semiconductor structure above a level of a top surface of the uppermost nanosheet layer may be removed to expose side surfaces of top and side surfaces of the fin structure and side surfaces of the uppermost intervening layer formed on the top surface of the uppermost nanosheet layer in the $2^{nd}$ multi-stack semiconductor structure. Thus, a lower portion of the $2^{nd}$ dummy gate structure below the level of the top surface of the uppermost nanosheet layer may remain in the $2^{nd}$ multi-stack semiconductor structure.

In operation S40 (FIG. 2D), the uppermost intervening layer may be removed from to separate the fin structure from the nanosheet stack in the $2^{nd}$ multi-stack semiconductor structure, and expose the top surface of the uppermost nanosheet layer and bottom surfaces of the fin structure may be exposed in the $2^{nd}$ multi-stack semiconductor structure.

In operation S50 (FIG. 2E), the lower portion of the $2^{nd}$ dummy gate structure may be removed from the $2^{nd}$ multi-stack semiconductor structure.

In operation S60 (FIG. 2F), a lower EG oxide layer may be conformally layered along the exposed top and side surfaces of the nanosheet stack to a desired thickness in the $2^{nd}$ multi-stack semiconductor structure. At the same time, the upper EG oxide layer may be conformally layered along the exposed top, bottom and side surfaces of the fin structure above the nanosheet stack in the $2^{nd}$ multi-stack semiconductor structure.

In operation S70 (FIG. 2G), the mask structure deposited on the $1^{st}$ multi-stack semiconductor structure may be removed to expose the $1^{st}$ multi-stack semiconductor structure, on which the $1^{st}$ dummy gate structure is formed, on the substrate, and then, the $1^{st}$ dummy gate structure may be removed in its entirely from the $1^{st}$ multi-stack semiconductor structure.

In operation S80 (FIG. 2H), the intervening layers may be removed as sacrificial layers in their entireties from the nanosheet stack in the $1^{st}$ multi-stack semiconductor structure to expose substantially all surfaces of the fin structure and the nanosheet layers in the $1^{st}$ multi-stack semiconductor structure.

In operation S90 (FIG. 2I), lower and upper gate oxide layers including corresponding interfacial layers IL and high-κ layers HK may be conformally formed on the lower and upper EG oxide layers in the $2^{nd}$ multi-stack semiconductor device. At the same time, lower and upper gate oxide layers including corresponding interfacial layers IL and high-κ layers HK may be conformally formed on the exposed surfaces of the nanosheet layers and the fin structure in the $1^{st}$ multi-stack semiconductor structure.

In operation S100 (FIGS. 2J and 2K), lower and upper gate metal patterns, each including corresponding work-function metal layers and conductor plugs, may be formed on the lower and upper gate oxide layers, respectively, in each of the $1^{st}$ and $2^{nd}$ multi-stack semiconductor devices to form an SG oxide multi-stack transistor and an EG oxide multi-stack transistor corresponding to the SG oxide multi-stack transistor 10 and EG oxide multi-stack transistor 20 shown in FIGS. 1A to 1F, respectively.

Figure 4:
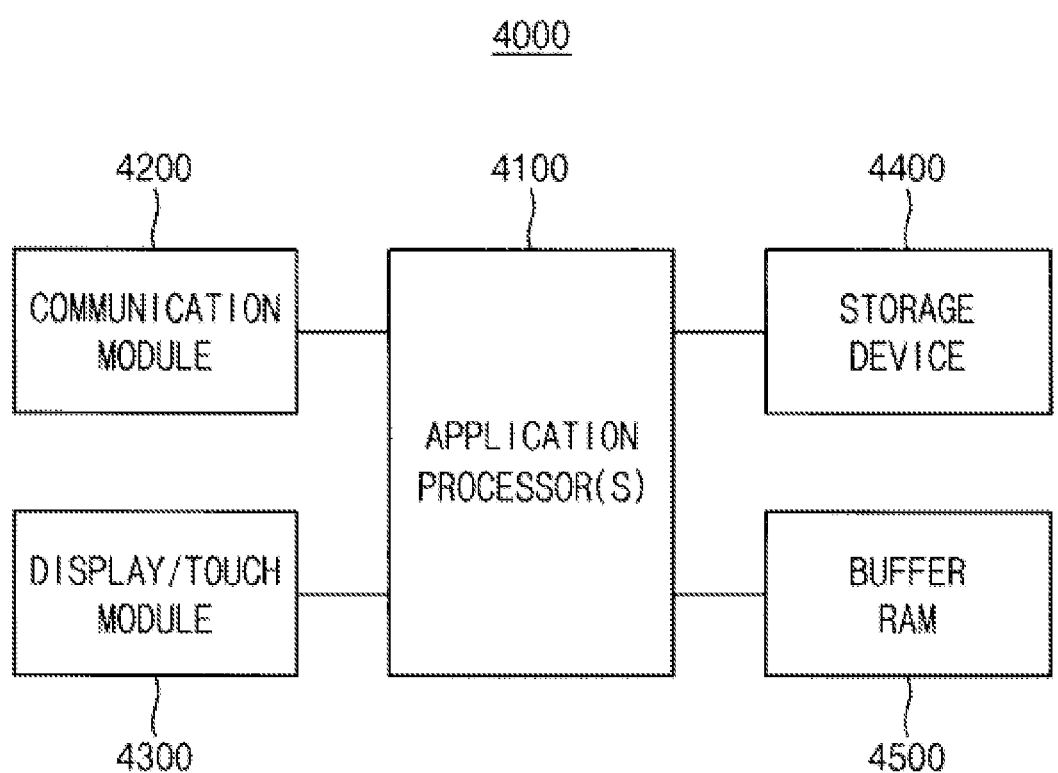
FIG. 4 illustrates a schematic block diagram of an electronic device including a multi-stack semiconductor device, according to an example embodiment

FIG. 4 is a schematic block diagram illustrating an electronic device including a multi-stack semiconductor device, according to an example embodiment.

Referring to FIG. 4, an electronic device 4000 may include at least one application processor 4100, a communication module 4200, a display/touch module 4300, a storage device 4400, and a buffer RAM 4500. The electronic device 4000 may be a mobile device such as a smartphone or a tablet computer, not being limited thereto, according to embodiments.

The application processor 4100 may control operations of the mobile device 4000. The communication module 4200 is implemented to perform wireless or wire communications with an external device. The display/touch module 4300 is implemented to display data processed by the application processor 4100 and/or to receive data through a touch panel. The storage device 4400 is implemented to store user data. The storage device 4400 may be an embedded multimedia card (eMMC), a solid state drive (SSD), a universal flash storage (UFS) device, etc. The storage device 4400 may perform caching of the mapping data and the user data as described above.

The buffer RAM 4500 may temporarily store data used for processing operations of the mobile device 4000. For example, the buffer RAM 4500 may be volatile memory such as double data rate (DDR) synchronous dynamic random access memory (SDRAM), low power double data rate (LPDDR) SDRAM, graphics double data rate (GDDR) SDRAM, Rambus dynamic random access memory (RDRAM), etc.

At least one component in the mobile device 4000 may include at least one of the multi-stack semiconductor devices including the SG oxide multi-stack transistor 10 and/or the EG oxide multi-stack transistor 20 described above in reference to FIGS. 1A-1G.

The foregoing is illustrative of exemplary embodiments and is not to be construed as limiting the inventive concept. Although a few exemplary embodiments have been described, those skilled in the art will readily appreciate that many modifications are possible in the above embodiments without materially departing from the inventive concept.

What is claimed is:

1. A multi-stack semiconductor device comprising:
    a substrate;
    a multi-stack transistor formed on the substrate and comprising a nanosheet transistor and a fin field-effect transistor (FinFET) above the nanosheet transistor,
    wherein the nanosheet transistor comprises a plurality nanosheet layers surrounded by a lower gate structure except between the nanosheet layers,
    wherein the FinFET comprises at least one fin structure, of which at least top and side surfaces are surrounded by an upper gate structure, and
    wherein each of the lower and upper gate structures comprises:
        a gate oxide layer formed on the nanosheet layers and the at least one fin structure; and
        a gate metal pattern formed on the gate oxide layer, the gate metal pattern comprising a work-function metal layer and a conductor plug.

2. The multi-stack semiconductor device of claim 1, wherein at least one of the lower and upper gate structures comprises an extra gate (EG) oxide layer formed between the gate oxide layer and the nanosheet layers and/or between the gate oxide layer and the at least one fin structure.

3. The multi-stack semiconductor device of claim 2, wherein the nanosheet layers comprises silicon (Si), and wherein silicon germanium (SiGe) is formed between the nanosheet layers.

4. The multi-stack semiconductor device of claim 3, wherein each of the lower and upper gate structures comprises the EG oxide layer formed between the gate oxide layer and the nanosheet layers and/or between the gate oxide layer and the at least one fin structure.

5. The multi-stack semiconductor device of claim 4, wherein the gate oxide layer comprises an interfacial layer and a high-κ layer,
wherein the interfacial layer comprises an oxide material, and
wherein the high-κ layer comprises a material with a dielectric constant higher than the oxide material of the interfacial layer.

6. The multi-stack semiconductor device of claim 1, wherein at least one of the lower and upper gate structures comprises an extra gate (EG) oxide layer formed between the gate oxide layer and the nanosheet layers and/or between the gate oxide layer and the at least one fin structure,
wherein a thickness of the gate oxide layer ranges 2 nm to 3 nm, and
wherein a thickness of the EG oxide layer ranges 4 nm to 5 nm.

* * * * *